(12) United States Patent
Yamamoto et al.

(10) Patent No.: US 7,680,171 B2
(45) Date of Patent: Mar. 16, 2010

(54) SEMICONDUCTOR LASER DEVICE, AND IMAGE DISPLAY DEVICE

(75) Inventors: Kazuhisa Yamamoto, Osaka (JP); Kiminori Mizuuchi, Osaka (JP); Shinichi Kadowaki, Hyogo (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/029,773

(22) Filed: Feb. 12, 2008

(65) Prior Publication Data

US 2008/0192787 A1   Aug. 14, 2008

(30) Foreign Application Priority Data

Feb. 13, 2007   (JP) .............................. 2007-031800
Mar. 1, 2007    (JP) .............................. 2007-050999

(51) Int. Cl.
*H01S 5/00* (2006.01)

(52) U.S. Cl. .............................. 372/50.12; 372/50.121; 372/50.122; 372/50.123; 372/50.124; 372/29.013; 372/38.05; 372/87

(58) Field of Classification Search .............. 372/50.12, 372/50.121–50.124, 29.013, 38.05, 87
See application file for complete search history.

(56) References Cited

U.S. PATENT DOCUMENTS 6,034,982  A  *  3/2000  Iwase .................... 372/50.12

7,016,383  B2     3/2006  Rice
2002/0003826 A1 * 1/2002  Yoneda .................... 372/50

FOREIGN PATENT DOCUMENTS

| JP | 5-211361   | 8/1993  |
|----|------------|---------|
| JP | 7-147453   | 6/1995  |
| JP | 7-202332   | 8/1995  |
| JP | 7-321399   | 12/1995 |
| JP | 8-116138   | 5/1996  |
| JP | 2003-23200 | 1/2003  |
| JP | 2005-45146 | 2/2005  |
| JP | 2005-72549 | 3/2005  |

* cited by examiner

*Primary Examiner*—Minsun Harvey
*Assistant Examiner*—Tod T Van Roy
(74) *Attorney, Agent, or Firm*—Wenderoth, Lind & Ponack, L.L.P.

(57) ABSTRACT

A semiconductor laser device and an image display device that efficiently release a heat from stripe active regions, and operated at a low-consumption current and a low-consumption electric power. A semiconductor laser element includes stripe active regions for emitting laser beams. On a base block, there are formed wirings electrically connected to stripe laser electrodes of the semiconductor laser element, respectively. The stripe laser electrodes corresponding to the stripe active regions are formed in proximity to a first surface of the semiconductor laser element, close to the active regions. An electric current is supplied to the active regions from connecting portions between each of the laser electrodes and the wirings.

6 Claims, 25 Drawing Sheets

FIG.4A

Pop=0.5W    $\lambda$=640nm

| SAMPLE NO. | Iop(A) | SLOPE EFFICIENCY (W/A) |
|---|---|---|
| 1 | 1.03 | 0.81 |
| 2 | 1.09 | 0.81 |
| 3 | 1.05 | 0.79 |
| 4 | 1.07 | 0.80 |
| AVERAGE VALUE | 1.06 | 0.803 |

Vop(AVERAGE VALUE)=2.2V

FIG.4B

Pop=0.5W    $\lambda$=640nm

| SAMPLE NO. | Iop(A) | SLOPE EFFICIENCY (W/A) |
|---|---|---|
| 1 | 1.13 | 0.77 |
| 2 | 1.10 | 0.79 |
| 3 | 1.08 | 0.78 |
| 4 | 1.11 | 0.78 |
| AVERAGE VALUE | 1.105 | 0.78 |

Vop(AVERAGE VALUE)=2.2V

FIG.22A

Pop=0.5W  λ=640nm  TL=25°C

| SAMPLE NO. | Iop(A) | SLOPE EFFICIENCY (W/A) |
|---|---|---|
| 1 | 1.03 | 0.81 |
| 2 | 1.09 | 0.81 |
| 3 | 1.05 | 0.79 |
| 4 | 1.07 | 0.80 |
| AVERAGE VALUE | 1.06 | 0.803 |

Vop(AVERAGE VALUE)=2.2V

FIG.22B

Pop=0.5W  λ=640nm  Ta=25°C

| SAMPLE NO. | Iop(A) | SLOPE EFFICIENCY (W/A) |
|---|---|---|
| 1 | 1.22 | 0.77 |
| 2 | 1.28 | 0.79 |
| 3 | 1.27 | 0.78 |
| 4 | 1.26 | 0.78 |
| AVERAGE VALUE | 1.256 | 0.78 |

Vop(AVERAGE VALUE)=2.28V

SEMICONDUCTOR LASER DEVICE, AND IMAGE DISPLAY DEVICE

BACKGROUND OF THE INVENTION

1. Field of the Invention

The present invention relates to a high-performance semiconductor laser device for use in an image display device such as a laser display device, and an image display device incorporated with the semiconductor laser device.

2. Description of the Background Art

In recent years, a large-screened and thin flat panel display device, as represented by plasma display devices or liquid crystal display devices, has been rapidly spread. A laser display device is being developed, as an example of a thin flat panel display device having a larger screen and a larger luminance. A semiconductor laser device with high luminance output and operable at a low-consumption electric power is used as a light source of the laser display device.

Watt-class high-output performance is required for the semiconductor laser device. In view of this, there is used a so-called multi-stripe semiconductor laser element constructed in such a manner that multiple stripe active regions are formed in the identical semiconductor laser element.

In the semiconductor laser device provided with the multi-stripe semiconductor laser element, it is required to uniformly supply a large electric current to multiple stripe electrodes for high-output performance. In view of this, some improvements are proposed by forming a wiring on a base block where the semiconductor laser element is mounted, or forming a wiring on the semiconductor laser element. There is proposed a first conventional art as an example of the improvements. In the first conventional art, electrode wiring patterns are formed independently of each other on a surface of a semiconductor laser element, and the electrode wiring patterns are electrically connected to multi-stripe electrodes, respectively (see e.g. Japanese Unexamined Patent Publication No. Hei 7-321399, Japanese Unexamined Patent Publication No. Hei 7-147453, and Japanese Unexamined Patent Publication No. 2005-45146). In the first conventional art, the electrode wiring patterns connected to the respective stripe electrodes are electrically connected to a conductive wire by an electrode pad provided in the periphery on the surface of the semiconductor laser element for current supply. In this arrangement, the multi-stripe semiconductor laser device is allowed to emit multiple laser beams.

A second conventional art discloses another multi-stripe semiconductor laser device having a wiring arrangement in the case where multiple electrodes are connected to stripe electrodes individually (see e.g. Japanese Unexamined Patent Publication No. 2003-23200). Specifically, the second conventional art discloses an example of wiring pattern configured in such a manner that an electrode pad is provided at a position to avoid contact with a conductive wire, in the case where the electrode pad and the other electrode are connected to each other by the conductive wire.

Since a watt-class high-output performance is required to drive the semiconductor laser device, a large electric current supply is required, which results in a large electric power consumption. As a result of the large electric power consumption, the semiconductor laser device is unduly heated. Unless appropriate cooling is conducted, supply of a larger electric current to the semiconductor laser device is required to maintain the watt-class high-output performance. As the further heating progresses, it may be impossible to secure the watt-class high-output performance of the semiconductor laser device, or the semiconductor laser device may be degraded.

In order to eliminate the above drawbacks, there is proposed a third conventional art. In the third conventional art, a semiconductor laser element or a semiconductor laser array element is mounted in a casing or a housing, and a coolant is allowed to flow in the casing or the housing. The semiconductor laser element or the semiconductor laser array element is prevented from being heated by directly cooling the semiconductor laser element or the semiconductor laser array element by the coolant, followed by drawing the coolant from the casing or a like member(see e.g. Japanese Unexamined Patent Publication No. Hei 8-116138, and Japanese Unexamined Patent Publication No. 2005-72549). The third conventional art is directed to enhance cooling effect by directly contacting the coolant with at least one of the surfaces of the semiconductor laser element or the semiconductor laser array element, and keeping cooling the surface by flow of the coolant.

There is proposed a fourth conventional art of cooling, with a coolant, a solid-state laser device incorporated with a semiconductor laser element as an excitation light source (see e.g. Japanese Unexamined Patent Publication No. Hei 5-211361 and Japanese Unexamined Patent Publication No. Hei 7-202332). Specifically, in the fourth conventional art, a coolant is drawn into a casing or a like member in which the entirety of the solid-state laser device including the semiconductor laser element is accommodated to directly cool the semiconductor laser element as an excitation light source or the solid-state laser device. This arrangement is advantageous in suppressing a temperature rise of the semiconductor laser element or the solid-state laser device, and stably maintaining the high-output performance of the semiconductor laser element or the solid-state laser device.

In the case where the multi-stripe semiconductor laser device is used as a light source of an image display device such as a panel display device, supply of a larger electric current is required, as compared with a case of using the semiconductor laser device in an optical disk device, a printer, or a like device. In driving the multi-stripe semiconductor laser device in the image display device, unless a heat generated in the stripe active regions is rapidly released from the active regions, the laser output may be saturated by the heat, thereby obstructing the high-output performance. Also, since a large electric current is supplied to the stripe active regions, an electric current flowing in a direction parallel to the stripe electrodes may be fluctuated, which may increase an operation current. As a result, another drawback such as unduly increase of an operation electric power may occur. Also, an increased electric current may degrade the semiconductor laser device.

The first and the second conventional arts disclose a wiring method or a conductive wire mounting method to solve the problems relating to mounting a multi-stripe semiconductor laser device. However, there is not disclosed a method for effectively releasing a heat generated in supplying a large electric current to a semiconductor laser device, or a method for uniformly supplying an electric current to stripe active regions.

The third and the fourth conventional arts disclose an approach of directly cooling an emission point of a semiconductor laser element, a laser chip, or a laser bar, but do not disclose an approach of efficiently cooling active regions of a semiconductor laser element. The third and the fourth conventional arts disclose an arrangement of drawing a coolant into a casing or a like member to directly cool a semiconductor laser element, followed by drawing the coolant from the casing or the like member, but do not disclose an arrangement of flowing a coolant to efficiently cool a laser beam emission end of a semiconductor laser element, or active regions for amplifying the laser beams; or an arrangement of efficiently releasing a heat by transferring the heat to a coolant. Further, the third and the fourth conventional arts do not disclose a safety-oriented arrangement of suspending an operation of a semiconductor laser device in the case where the semiconductor laser device is tilted by e.g. tipping over.

SUMMARY OF THE INVENTION

In view of the above problems residing in the conventional examples, it is an object of the present invention to provide a semiconductor laser device and an image display device that enable to efficiently release a heat from stripe active regions and be operated at a low-consumption current and a low-consumption electric power.

It is another object of the present invention to provide an image display device, incorporated with the semiconductor laser device as a light source, which is operated at a low-consumption current and a low-consumption electric power, and with a long operation life.

A semiconductor laser device according to an aspect of the present invention comprises: a semiconductor laser element including stripe active regions for emitting laser beams; and a base block on which wirings are formed, the wirings being electrically connected to stripe laser electrodes of the semiconductor laser element, respectively, the stripe laser electrodes corresponding to the stripe active regions being formed in proximity to a first surface of the semiconductor laser element, close to the active regions, wherein an electric current is supplied to the active regions from connecting portions between each of the laser electrodes and the wirings.

In the above arrangement, a heat generated in the stripe active regions is efficiently released from the wirings connected to the active regions, and the base block via each of the laser electrodes. Also, the electric current is uniformly supplied to the active regions from the connecting portions between the laser electrodes and the wirings. Thus, since the supplied electric current is efficiently converted into high-output laser beams, the semiconductor laser device can be operated at a low-consumption current and a low-consumption electric power.

An image display device according to another aspect of the invention comprises a screen; laser light sources; and an optical system for forming an image on the screen, using the laser light sources, wherein the laser light sources includes at least a red laser light source for emitting red laser beams, a green laser light source for emitting green laser beams, and a blue laser light source for emitting blue laser beams, and at least one of the red laser light source and the blue laser light source includes the aforementioned semiconductor laser device.

In the above arrangement, since the laser light sources can be operated at a low-consumption current and a low-consumption electric power, and with a long operation life, the image display device can be operated at a low-consumption current and a low-consumption electric power, and with a long operation life.

An image display device according to yet another aspect of the invention comprises a liquid crystal display panel; and a backlight illuminator for illuminating the liquid crystal display panel from a backside, wherein the backlight illuminator includes at least a red laser light source for emitting red laser beams, a green laser light source for emitting green laser beams, and a blue laser light source for emitting blue laser beams, and at least one of the red laser light source and the blue laser light source includes the aforementioned semiconductor laser device.

In the above arrangement, since the laser light sources can be operated at a low-consumption current and a low-consumption electric power, and with a long operation life, the image display device can be operated at a low-consumption current and a low-consumption electric power, and with a long operation life.

These and other objects, features and advantages of the present invention will become more apparent upon reading the following detailed description along with the accompanying drawings.

BRIEF DESCRIPTION OF THE DRAWINGS

FIGS. 4A and 4B are charts showing characteristics of the semiconductor laser device of the first embodiment, and characteristics of a conventional semiconductor laser device, respectively.

FIGS. 22A and 22B are charts showing characteristics of the semiconductor laser device as the modification of the sixth embodiment, and characteristics of a conventional semiconductor laser device.

DETAILED DESCRIPTION OF THE INVENTION

Figure 1:
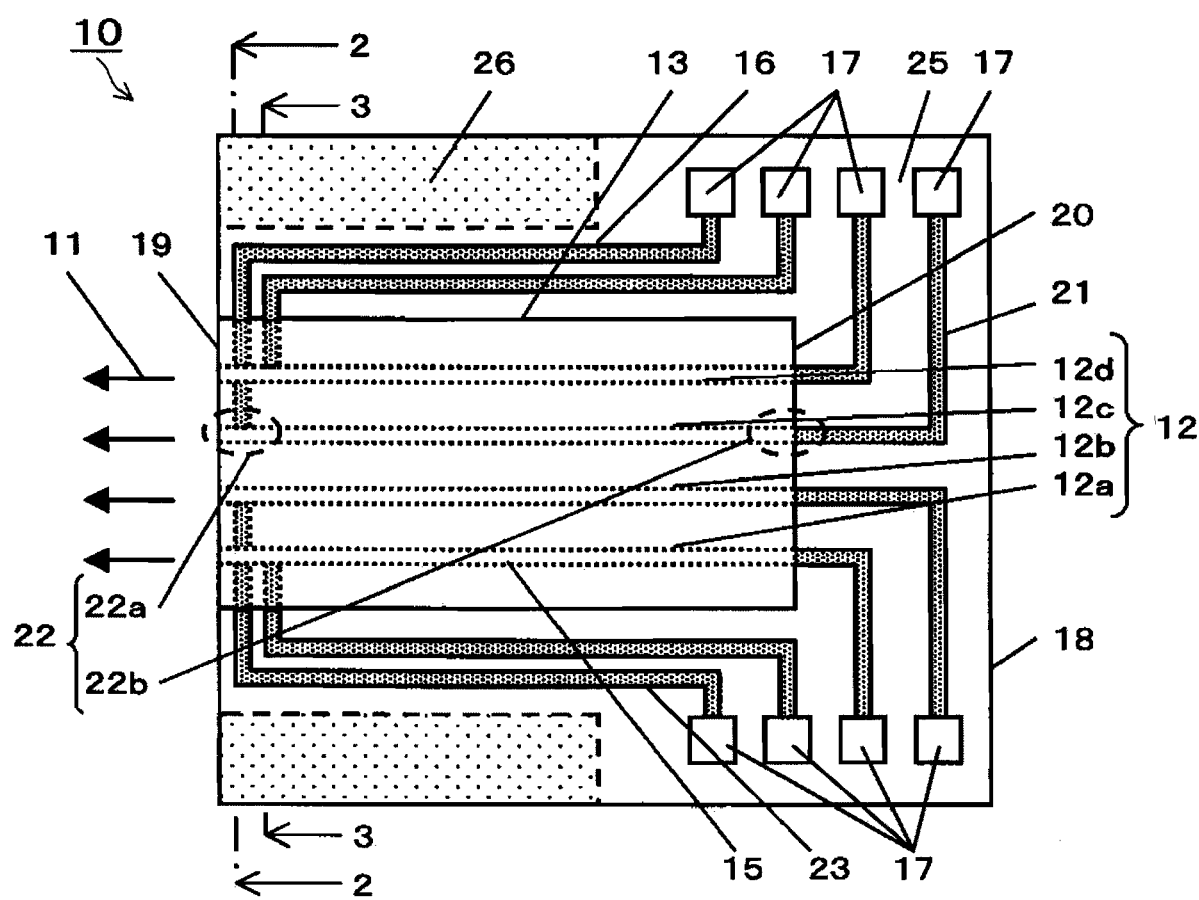
FIG. 1 is a top plan view schematically showing a mounted state of a semiconductor laser device as a first embodiment of the invention.

In the following, embodiments of the invention are described referring to the accompanying drawings. The following embodiments are merely examples embodying the invention, and do not limit the technical scope of the invention. Repeated description on the elements with the same reference numerals throughout the drawings may be omitted according to needs.

First Embodiment

Figure 2:
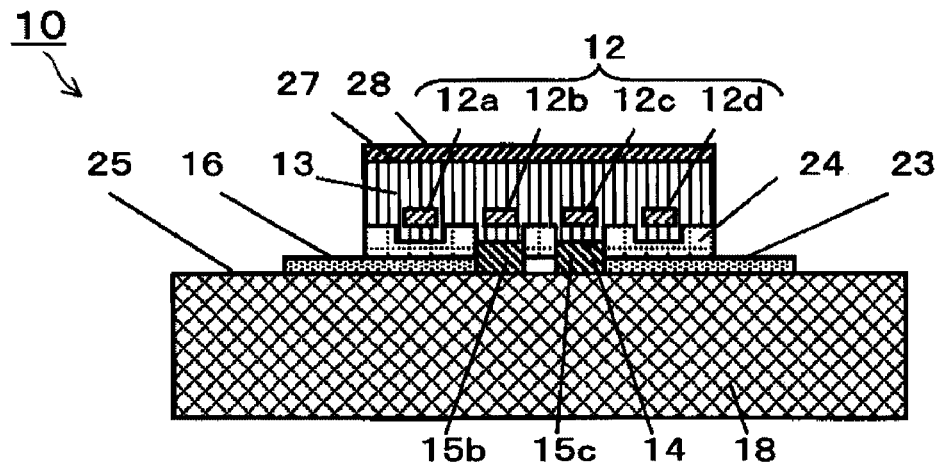
FIG. 2 is a cross-sectional view, taken along the line 2-2 in FIG. 1, schematically showing the mounted state of the semiconductor laser device.
Figure 3:
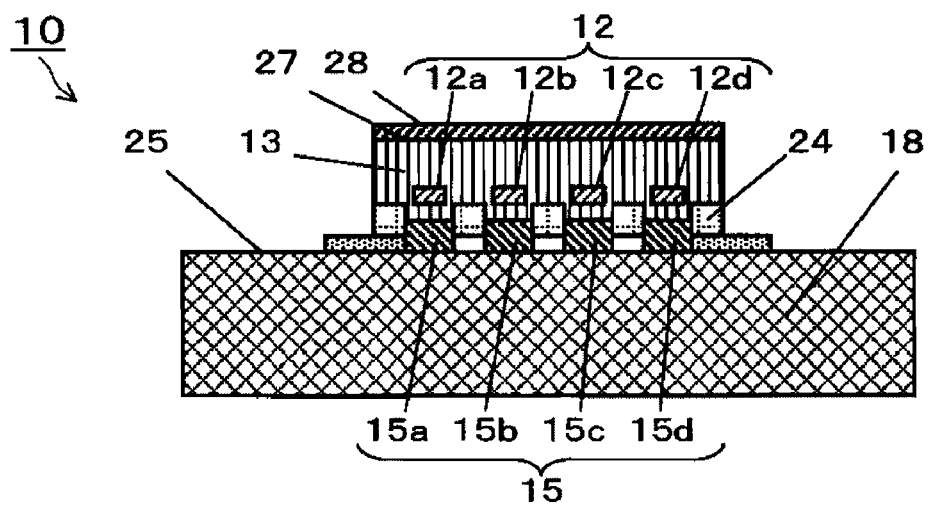
FIG. 3 is a cross-sectional view, taken along the line 3-3 in FIG. 1, schematically showing the mounted state of the semiconductor laser device.

FIGS. 1 through 4B are diagrams for describing a semiconductor laser device as the first embodiment of the invention. FIGS. 1 through 3 are diagrams schematically showing an arrangement of a semiconductor laser device 10 as the first embodiment of the invention. FIG. 1 is a top plan view schematically showing a mounted state of the semiconductor laser device 10 as the first embodiment. FIG. 2 is a cross-sectional view, taken along the line 2-2 in FIG. 1, schematically showing the mounted state of the semiconductor laser device 10.

FIG. 3 is a cross-sectional view, taken along the line 3-3 in FIG. 1, schematically showing the mounted state of the semiconductor laser device 10.

As shown in FIGS. 1 and 2, the semiconductor laser device 10 includes a semiconductor laser element 13 having multiple stripe active regions 12 i.e. stripe active regions 12a, 12b, 12c, and 12d for emitting laser beams 11; and a base block 18 provided with wirings and electrode parts 17. Stripe laser electrodes 15 i.e. stripe laser electrodes 15a, 15b, 15c, and 15d of the semiconductor laser element 13, which are formed in proximity to a first surface 14 of the semiconductor laser element 13, close to the active regions 12, are electrically connected to the wirings. The wirings formed on the base block 18 of the semiconductor laser device 10 are connected to the active regions 12 via the laser electrodes 15, respectively. Specifically, the wiring 16 is connected to the active region 12c at a connecting portion 22a close to a front end surface 19 of a laser resonator, and the wiring 21 is connected to the active region 12c at a connecting portion 22b close to a rear end surface 20 of the laser resonator. In this wiring arrangement, an electric current is supplied to the active region 12c from the two connecting portions 22a and 22b at which the laser electrode 15c is connected to the wirings 16 and 21, respectively, whereby the laser beam 11 is emitted from the front end surface 19. The active regions 12 constituted of the stripe active regions 12a, 12b, 12c, and 12d each has the same arrangement as described above. In this arrangement, the semiconductor laser device 10 having the arrangement shown in FIG. 1 is allowed to emit e.g. four laser beams simultaneously.

As shown in FIG. 1, one of the multiple active regions 12 e.g. the active region 12c is formed on the base block 18 via the stripe laser electrode 15c from the front end surface 19 of the semiconductor laser element 13 to the rear end surface 20 thereof, and a heat generated in the active region 12c is efficiently released therefrom via the wirings 16, and the base block 18. The other active regions 12 i.e. the active regions 12a, 12b, and 12d have the same arrangement as the active region 12c. A site where the wiring 23 (16) and the active region 12a (12d) intersect with each other is covered with an insulating protective film 24, in place of the laser electrode 15a (15d), as shown in FIGS. 2 and 3.

The wirings 16 and 21 are connected to the electrode parts 17 formed in the periphery of a laser mounting surface 25 on the base block 18 where the semiconductor laser element 13 is mounted. Specifically, the active regions 12 are electrically connected to the electrode parts 17 via multiple connecting portions 22. For instance, the active region 12c is connected to the wiring 16 at the connecting portion 22a close to the front end surface 19, and is connected to the wiring 21 at the connecting portion 22b close to the rear end surface 20 for electrical connection to the corresponding electrode part 17. With this arrangement, the active region 12c is allowed to emit the laser beam 11 in response to supply of an electric current from both ends of the stripe active region 12c via the laser electrode 15c. The other active regions 12a, 12b, and 12d have the same arrangement as the active region 12c, as shown in FIGS. 1 through 3. A rear electrode 28 is formed on a second surface 27 opposing to the first surface 14 of the semiconductor laser element 13.

In the above arrangement, the heat generated in the stripe active regions 12 is efficiently released from the wirings connected to the active regions 12, and the base block 18 via each of the laser electrodes 15. Also, an electric current to be supplied to the active regions 12 is uniformly supplied from the connecting portions 22a and 22b at which the wirings are connected to the active regions 12. Thus, the electric current supplied to the stripe active regions 12 is efficiently converted into high-output laser beams. This enables to advantageously operate the semiconductor laser device 10 at a low-consumption current and a low-consumption electric power. This allows for efficient electrical connection to a package electrode or a circuit board electrode.

As shown in FIG. 1, the semiconductor laser element 13 constitutes a laser resonator by the front end surface 19 perpendicular to the stripe active regions 12 and adapted to emit laser beams, and the rear end surface 20 opposing to the front end surface 19. The base block 18 has a larger size than the semiconductor laser element 13 constituting the laser resonator at a rear position of the rear end surface 20 of the semiconductor laser element 13. The electrode parts 17 are formed on the laser mounting surface 25 at a rear position of the base block 18. Forming the electrode parts 17 at the rear position of the base block 18 is advantageous in extending the wirings from the connecting portions 22 of the stripe laser electrodes 15 formed on the laser mounting surface 25 rearwardly of the base block 18. This enables to properly connect the laser electrodes 15 of the semiconductor laser element 13 to the electrode parts 17 formed on the laser mounting surface 25.

In the above arrangement, for instance, in the case where the semiconductor laser device 10 as a light source is mounted in a casing of a display device, it is important to define a reference plane for adjusting an optical path of a laser beam. The optical path of the laser beam can be easily adjusted by mounting the semiconductor laser device 10 while matching the reference plane of the casing with a reference plane 26 of the semiconductor laser device 10. Specifically, the front end surface 19 of the semiconductor laser element 13 is mounted perpendicular to the reference plane 26. Thereby, the laser beam 11 is emitted in a direction perpendicular to the front end surface 19 and parallel to the reference plane 26. Defining the reference plane 26 on the base block 18 enables to efficiently release the heat generated in the semiconductor laser device 10 to e.g. the casing of the display device via the reference plane 26.

In the following, an advantage of the first embodiment is described by comparing characteristics of the semiconductor laser device of the first embodiment with characteristics of a conventional semiconductor laser device disclosed in the first conventional art, in the case where the semiconductor laser element 13 fabricated from an identical wafer is mounted in the semiconductor laser device of the first embodiment, and the conventional semiconductor laser device, respectively.

FIG. 4A is a chart showing the characteristics of the semiconductor laser device of the first embodiment. FIG. 4B is a chart showing the characteristics of the conventional semiconductor laser device.

The semiconductor laser element used in the comparison emits red laser beams of 640 nm wavelength. The semiconductor laser element has such dimensions that the length, the width, and the thickness of the laser resonator are 2 mm, 1 mm, and 150 μm, respectively. The length, the width, and the thickness of each of the active regions are 2 mm, 100 μm, and 0.08 μm, respectively. The interval of the adjoining active regions is 200 μm. Both of the laser electrode and the rear electrode have a surface made of a gold material. Each of the active regions is so designed as to emit a laser beam of 0.5 watt. Since the semiconductor laser device has four active regions as shown in FIG. 1, the semiconductor laser device outputs laser beams of 2 watts in total i.e. outputs a watt-class laser power.

It is possible to drive the four active regions independently of each other by the respective corresponding laser electrodes. Individual driving provides the following advantage. For instance, even if one of the four active regions is degraded, the semiconductor laser device is continuously operable by emitting laser beams from the remaining three stripe active regions.

In the semiconductor laser device of the first embodiment, an electric current is supplied to a corresponding one of the active regions by the multiple wirings to uniformly supply the electric current to the targeted active region. Accordingly, as is obvious from the data shown in FIGS. 4A and 4B, as compared with the conventional semiconductor laser device, the semiconductor laser device of the first embodiment has improved characteristics that the operation current Iop is increased by about 5% in average, and the slope efficiency is increased by about 3% in average. Thus, the arrangement of the semiconductor laser device shown in FIG. 1 is advantageous in operating the semiconductor laser device at a low-consumption current.

Since the average value of the operation voltage Vop is 2.2V in both of the semiconductor laser device of the first embodiment, and the conventional semiconductor laser device, the consumption electric power is decreased in proportional to the consumption current. Accordingly, as compared with the conventional semiconductor laser device, the semiconductor laser device of the first embodiment can be operated at a low-consumption electric power, in addition to the low-consumption current. Also, the operation life of the semiconductor laser device of the first embodiment is longer than the operation life of the conventional semiconductor laser device by about 1.5 times.

In the first embodiment, the semiconductor laser device is described by taking an example of an AlGaInP-based red semiconductor laser device for emitting laser beams of 640 nm wavelength. Alternatively, it is possible to use a semiconductor laser device with an output wavelength different from that of the aforementioned semiconductor laser device, or using a material different from the material of the aforementioned semiconductor laser device. For instance, as far as the semiconductor laser device is used in an image display device such as a panel display device, various semiconductor laser devices including a GaN-based blue semiconductor laser device, and a multi-wavelength semiconductor laser device such as a dual wavelength semiconductor laser device may be used. It is needless to say that an infrared semiconductor laser device using a basic wave for use in green wavelength conversion is usable.

Second Embodiment

Figure 5:
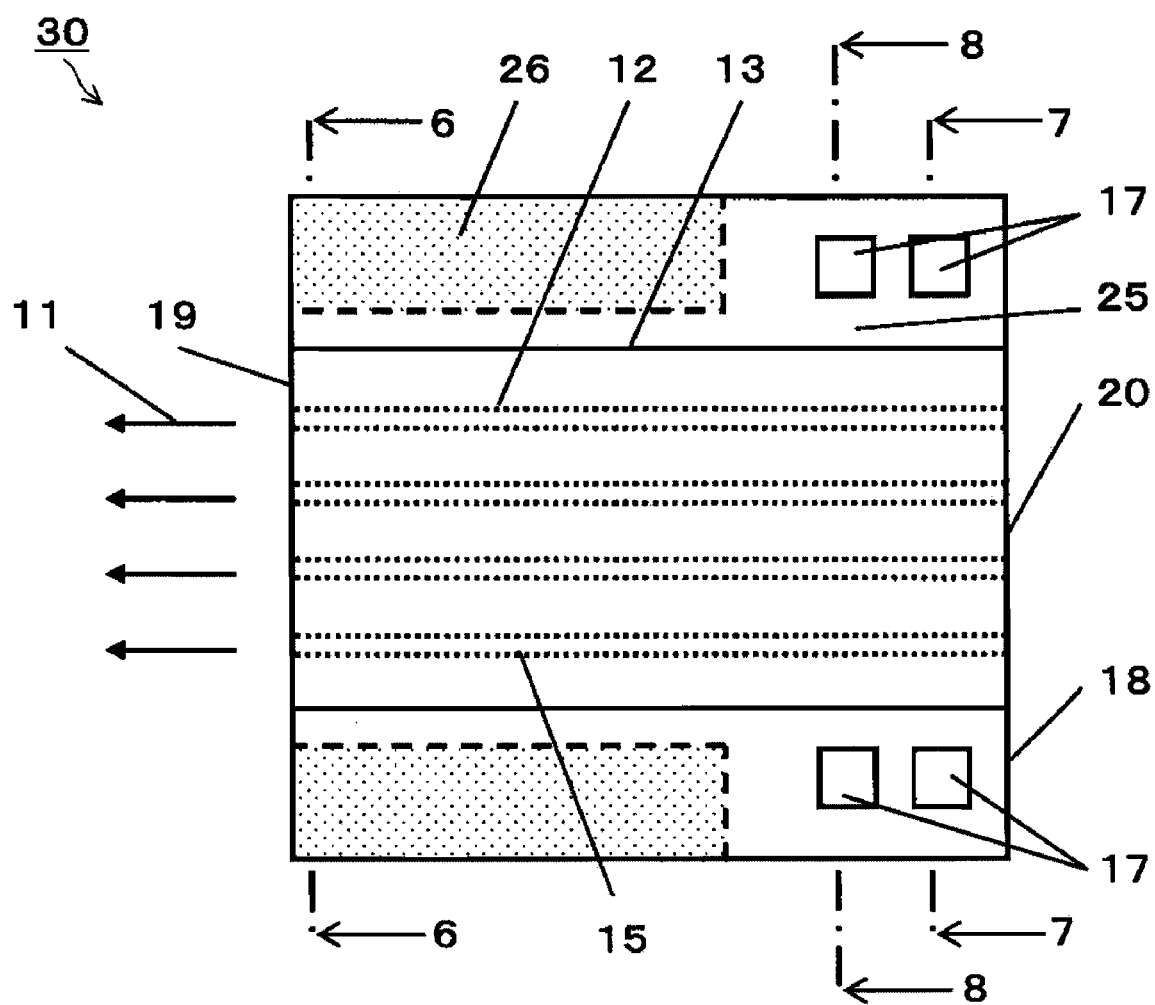
FIG. 5 is a top plan view schematically showing a mounted state of a semiconductor laser device as a second embodiment of the invention.
Figure 6:
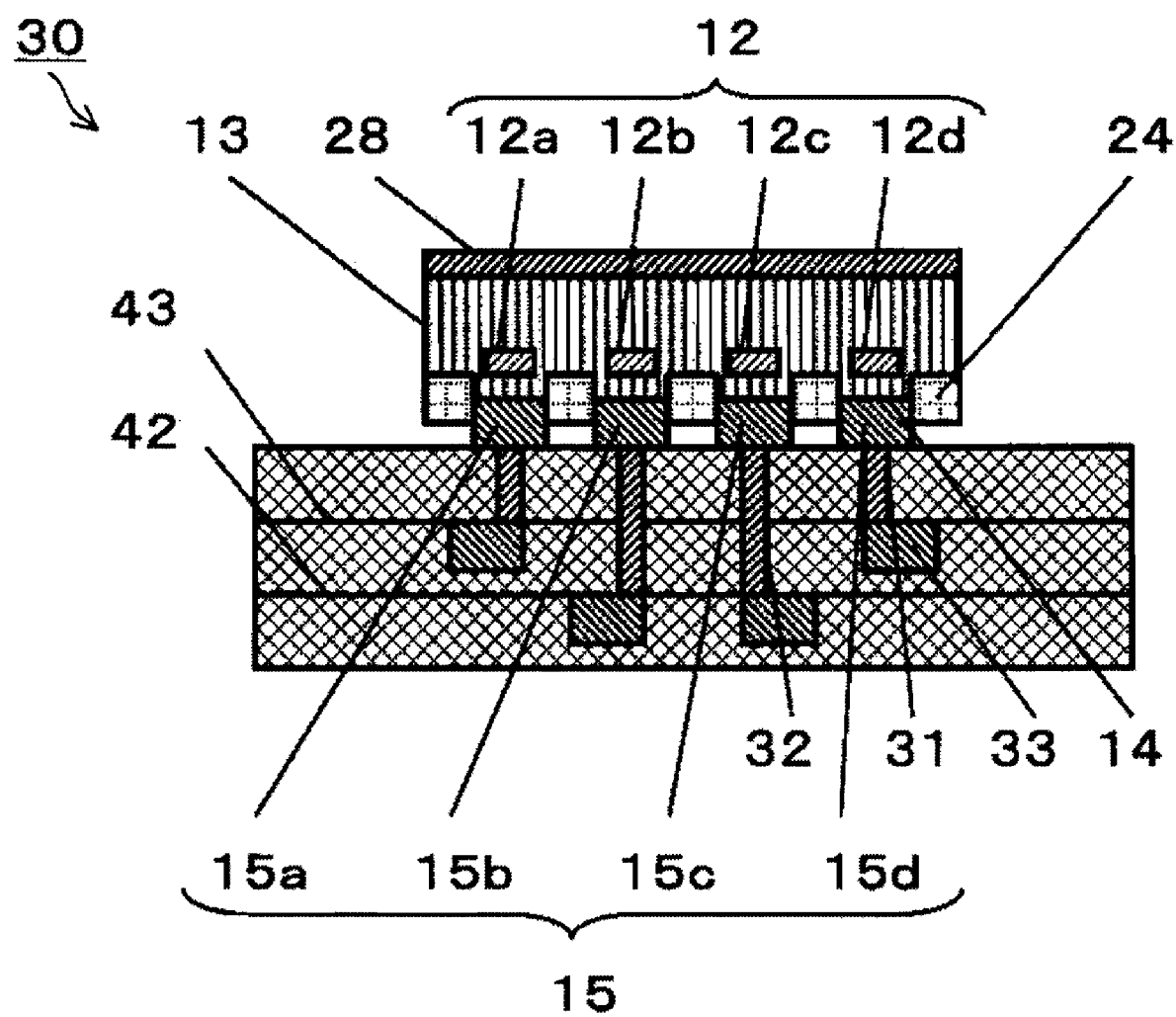
FIG. 6 is a cross-sectional view, taken along the line 6-6 in FIG. 5, schematically showing the mounted state of the semiconductor laser device.
Figure 7:
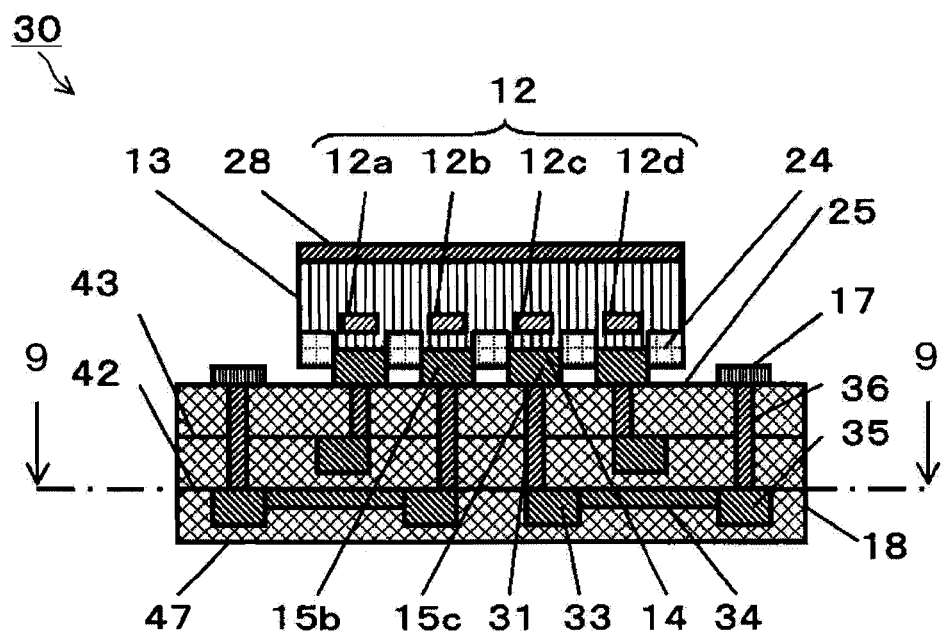
FIG. 7 is a cross-sectional view, taken along the line 7-7 in FIG. 5, schematically showing the mounted state of the semiconductor laser device.
Figure 8:
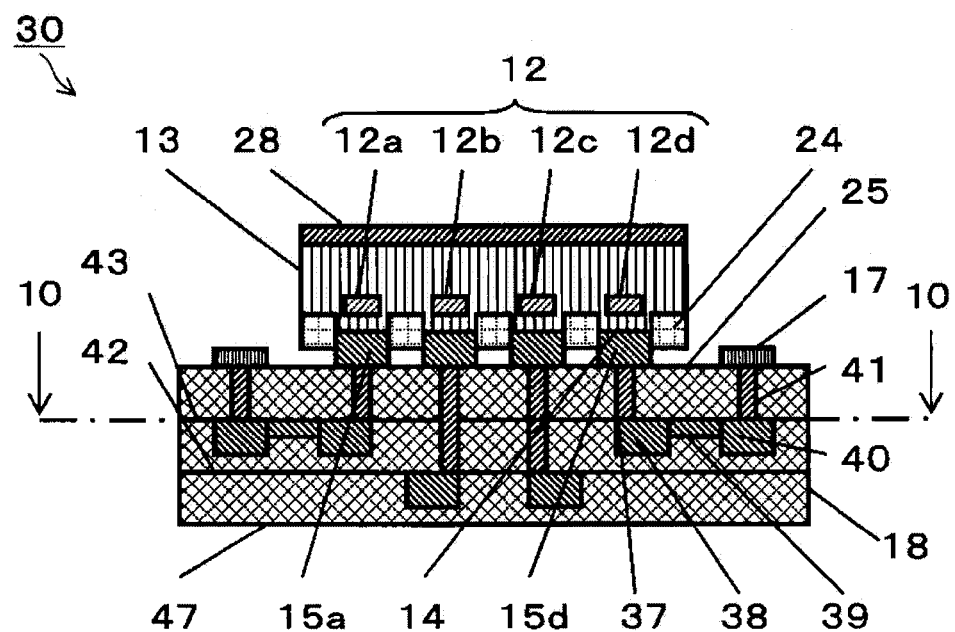
FIG. 8 is a cross-sectional view, taken along the line 8-8 in FIG. 5, schematically showing the mounted state of the semiconductor laser device.

FIGS. 5 through 9 are diagrams for describing a semiconductor laser device as the second embodiment of the invention. FIGS. 5 through 8 are diagrams schematically showing an arrangement of a semiconductor laser device 30 as the second embodiment. FIG. 5 is a top plan view schematically showing a mounted state of the semiconductor laser device 30 as the second embodiment. FIG. 6 is a cross-sectional view, taken along the line 6-6 in FIG. 5, schematically showing the mounted state of the semiconductor laser device 30. FIG. 7 is a cross-sectional view, taken along the line 7-7 in FIG. 5, schematically showing the mounted state of the semiconductor laser device 30. FIG. 8 is a cross-sectional view, taken along the line 8-8 in FIG. 5, schematically showing the mounted state of the semiconductor laser device 30.

As shown in FIGS. 5 and 6, the semiconductor laser device 30 includes a semiconductor laser element 13 having multiple stripe active regions 12 i.e. stripe active regions 12a, 12b, 12c, and 12d for emitting laser beams 11; and a base block 18 provided with wirings and electrode parts 17. Stripe laser electrodes 15 i.e. stripe electrodes 15a, 15b, 15c, and 15d of the semiconductor laser element 13 are formed in proximity to a first surface 14 of the semiconductor laser element 13, close to the active regions 12, and are electrically connected to the wirings 31 and 32. As shown in FIG. 6, the wirings 31 and 32 are formed inside the base block 18. Multiple wirings 33 are formed inside the base block 18 of the semiconductor laser device 30, and are connected to the active regions 12 via the laser electrodes 15, respectively. The wirings 33 have substantially the same length and extend in parallel to the active regions 12. In other words, the base block 18 is internally formed with internal wiring pattern forming surfaces 42 and 43 on which a wiring pattern or the like is formed.

As shown in FIG. 7, the active region 12c is connected to a corresponding one of the wirings 31 which extends vertically downward from a laser mounting surface 25 in the base block 18 via the laser electrode 15c. The wiring 31 is connected to a corresponding one of the wirings 33 formed in parallel to the active region 12c. The wiring 33 is connected to a corresponding wiring 34 which is connected perpendicular to the wiring 31. The wiring 34 extends vertically upward from a corresponding connecting portion 35, and is connected to a corresponding wiring 36 to be connected to the corresponding electrode part 17. The active region 12b has substantially the same wiring arrangement as the active region 12c except that the wiring arrangement of the active region 12b is mirror reversed to the wiring arrangement of the active region 12c. In this way, the active regions 12b and 12c are connected to the respective corresponding electrode parts 17 in the aforementioned manner.

Similarly to the above, as shown in FIG. 8, the active region 12d is connected to a corresponding wiring 37 which extends vertically downward from the laser mounting surface 25 in the base block 18 via the laser electrode 15d. The wiring 37 is connected to a corresponding wiring 38 formed in parallel to the active region 12d. The wiring 38 is connected to a corresponding wiring 39 which is connected perpendicular to the wiring 37. The wiring 39 extends upward from a corresponding connecting portion 40, and is connected to a corresponding wiring 41 to be connected to the corresponding electrode part 17. The active region 12a has substantially the same wiring arrangement as the active region 12d except that the wiring arrangement of the active region 12a is mirror reversed to the wiring arrangement of the active region 12d. In this way, the active regions 12a and 12d are connected to the respective corresponding electrode parts 17 in the aforementioned manner.

Figure 9:
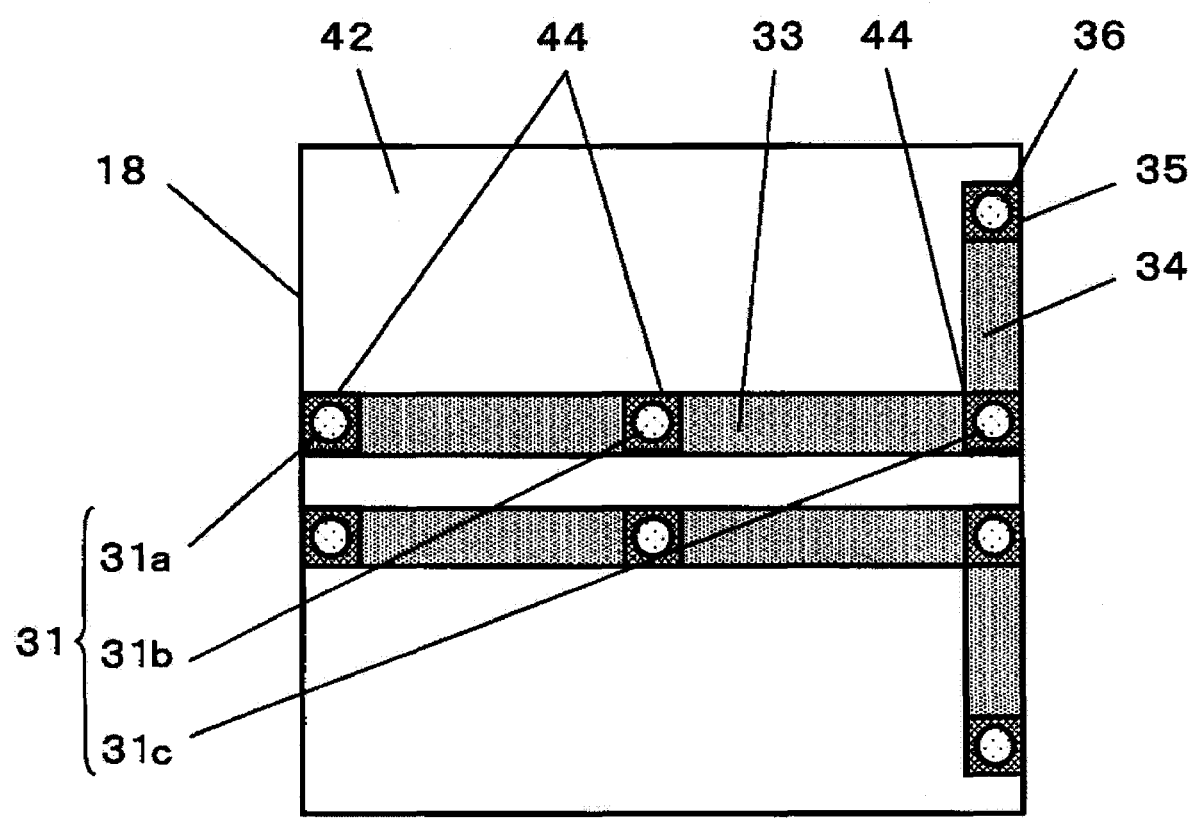
FIG. 9 is a plan view of an internal arrangement of the semiconductor laser device in a state that an upper portion of the semiconductor laser device with respect to a plane corresponding to the line 9-9 in FIG. 7 is removed.
Figure 10:
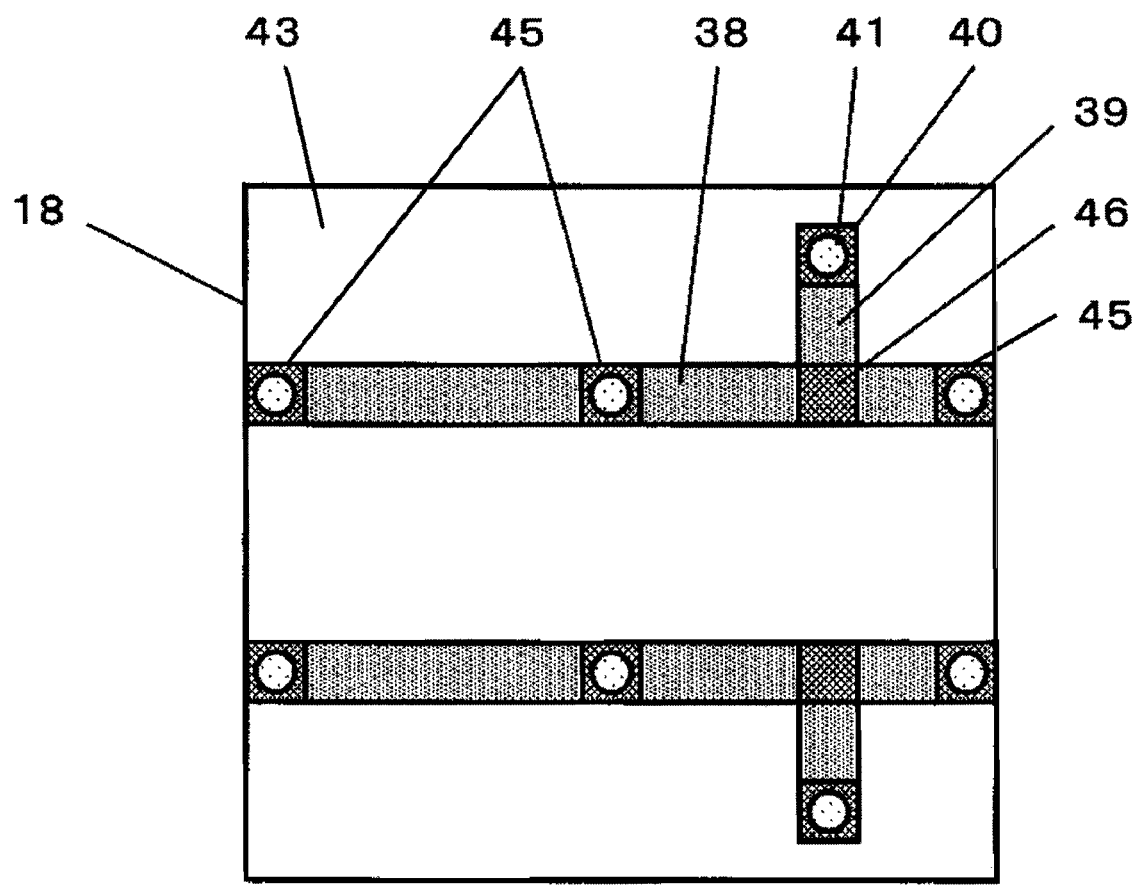
FIG. 10 is a plan view of an internal arrangement of the semiconductor laser device in a state that an upper portion of the semiconductor laser device with respect to a plane corresponding to the line 10-10 in FIG. 8 is removed.

In the following, wiring on the internal wiring pattern forming surface of the base block 18 is described. FIG. 9 is a plan view of the internal wiring pattern forming surface 42 in a state that an upper portion of the base block 18 with respect to a plane corresponding to the line 9-9 in FIG. 7 is removed. FIG. 10 is a plan view of the internal wiring pattern forming surface 43 in a state that an upper portion of the base block 18 with respect to a plane corresponding to the line 10-10 in FIG. 8 is removed.

As shown in FIG. 9, each wiring 33 has a connecting portion 44 at three sites i.e. a site near a front end surface of the semiconductor laser element, a site near a rear end surface of the semiconductor laser element, and a site near a middle part of the semiconductor laser element, at which the wiring 31 is connected to the corresponding laser electrode. An electric current is supplied from the three connecting portions 44 to the corresponding active region (not shown) of the semiconductor laser element for outputting a laser beam. The wiring 33 extends to a position immediately below the corresponding electrode part 17 by the wiring 34. The wiring 34 is connected to the corresponding electrode part 17 (not shown) by the wiring 36 extending upward from the corresponding connecting portion 35.

Similarly to the arrangement of FIG. 9, referring to FIG. 10, each wiring 38 has a connecting portion 45 at three sites i.e. a site near the front end surface of the semiconductor laser element, a site near the rear end surface of the semiconductor laser element, and a site near the middle part of the semiconductor laser element, at which the wiring 37 is connected to the corresponding laser electrode. An electric current is supplied from the three connecting portions 45 to the corresponding active region (not shown) of the semiconductor laser element for outputting a laser beam. The wiring 38 extends to a position immediately below the corresponding electrode part 17 by the wiring 39 via a corresponding connecting portion 46. The wiring 39 is connected to the corresponding electrode part 17 (not shown) by the wiring 41 extending upward from the corresponding connecting portion 40.

As described above, the semiconductor laser device 30 has an arrangement that wirings 31a, 31b, and 31c (see FIG. 9) connected to an identical laser electrode e.g. the laser electrode 15c are jointly connected to the wiring 33 so that the wirings 31a, 31b, and 31c are connected to the respective corresponding electrode parts 17 formed in the periphery of the laser mounting surface 25 on the base block 18 where the semiconductor laser element 13 is mounted, as shown in FIG. 7. Further, as described above, a wiring is formed in the base block 18, specifically, on at least one of a rear surface 47 opposing to the laser mounting surface 25, and the internal wiring pattern forming surface 42 (43) in the base block 18, which is formed in parallel to the laser mounting surface 25. In this embodiment, the wiring is formed on the internal wiring pattern forming surface 42 (43).

In the above arrangement, even if an electric current is supplied from an external power source to a targeted electrode part by a single wiring, the electric current is supplied to the targeted active region from the multiple sites of the identical laser electrode by the multiple wirings formed on the base block or inside the base block. Thereby, the electric current is uniformly supplied to the active region from the multiple connecting portions of the laser electrode connected to the multiple wirings. Further, by utilizing the wirings formed inside the base block, the semiconductor laser element is advantageous in supplying an electric current to an intended portion of the stripe active regions. Specifically, by stereoscopically forming wirings on the internal wiring pattern forming surface to be formed inside the base block 18, an electric current can be supplied to an intended portion of the active regions from the electrode parts 17 formed in the periphery of the laser mounting surface 25 on the base block 18. This enables to uniformly supply the electric current to the stripe active regions.

Similarly to the first embodiment, the semiconductor laser device 30 having the above arrangement efficiently converts the supplied electric current into high-output laser beams. This enables to operate the semiconductor laser device 30 at a low-consumption current and a low-consumption electric power.

Third Embodiment

Figure 11:
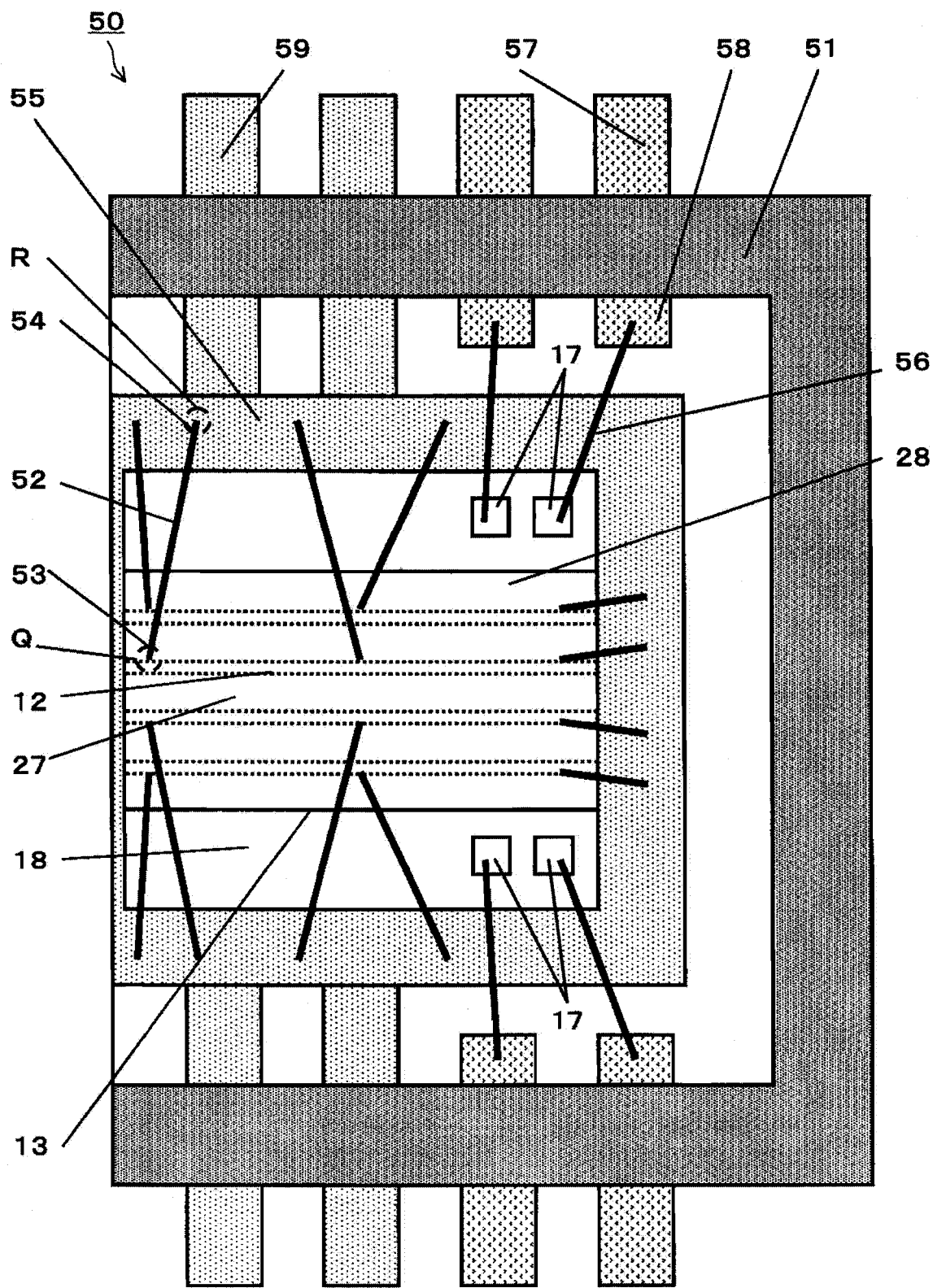
FIG. 11 is a top plan view schematically showing a mounted state of a semiconductor laser device as a third embodiment of the invention.

FIGS. 11 through 14 are diagrams for describing a semiconductor laser device as the third embodiment of the invention. FIG. 11 is a top plan view schematically showing a mounted state of a semiconductor laser device 50 as the third embodiment of the invention. The semiconductor laser device 50 shown in FIG. 11 is constructed by mounting the semiconductor laser device 10 or 30 of the first or the second embodiment in a package 51.

Specifically, unlike the semiconductor laser device 10 or 30 of the first or the second embodiment, the semiconductor laser device 50 shown in FIG. 11 additionally includes the package 51 for mounting a base block 18 provided with a semiconductor laser element 13. A rear electrode 28 is formed on a second surface 27 of the semiconductor laser element 13, which is opposed to a first surface (not shown) of the semiconductor laser element 13 and in parallel thereto, close to active regions of the semiconductor laser element 13. The rear electrode 28 is connected to respective one ends 53 of conductive wires 52 along stripe active regions 12, and the respective other ends 54 of the conductive wires 52 are connected to a connecting electrode part 55 of the package 51. In this embodiment, for instance, the one end 53 of each of the conductive wires 52 is connected to a region Q indicated by a broken-line portion on the rear electrode 28, and the other end 54 thereof is connected to a region R indicated by a broken-line portion on the connecting electrode part 55. As shown in FIG. 11, the connecting electrode part 55 is formed by gold-plating the base block 18, as a metal block, which is electrically connected to the semiconductor laser element 13. In this embodiment, the base block 18 is connected to the conductive wires 52 disposed on the package 51. Alternatively, the base block 18 may be mounted on a circuit board and connected to the conductive wires.

The conductive wires 52 shown in FIG. 11 are connected to a corresponding one of the active regions 12 at three sites i.e. at both ends, and a middle portion of the active region 12. The semiconductor laser element 13 shown in FIG. 11 has a laser array structure provided with four active regions 12. Therefore, three conductive wires 52 are provided on each of the active regions 12, and twelve conductive wires 52 in total are connected to the rear electrode 28 of the semiconductor laser element 13. The respective one ends 53 of the conductive wires 52 are connected to the rear electrode 28 with a matrix pattern.

Each of the one ends 53 of the conductive wires 52 is connected to the rear electrode 28 at a position opposing to a corresponding laser electrode with respect to the corresponding active region 12.

Referring to FIG. 11, out of the three conductive wires 52 to be connected to a targeted active region 12, the conductive wire 52 connected to a front end surface of the active region 12, and the conductive wire 52 connected to the middle portion of the active region 12 are connected to an identical lateral side of the connecting electrode part 55. However, the embodiment is not limited to the above configuration. The conductive wires 52 may be connected to different lateral sides of the connecting electrode part 55.

In the above arrangement, an electric current is supplied from the multiple connecting portions on the laser electrodes on the first surface of the semiconductor laser element, and the rear electrode on the second surface of the semiconductor laser element along the active regions, and discharged. This enables to uniformly collect the electric current within the active regions. Specifically, since the multiple conductive wires 52 are connected to the rear electrode from which the electric current is to be discharged along the active regions, the electric current is more uniformly discharged from the entirety of the active regions. Since the connecting portions of the conductive wires 52 are discretely provided to avoid local discharge of the electric current from a specific site of the rear electrode, the electric current can be more uniformly discharged from the entirety of the active regions. The connecting portions of the conductive wires 52 are discretely provided in the array direction of the active regions, as well as the extending direction of the active regions.

The laser electrodes (not shown) of the semiconductor laser device 50 shown in FIG. 11 are electrically connected to electrode parts 17 by wirings (not shown) formed inside the base block 18. Each of the electrode parts 17 is connected to a connecting electrode part 58 of a corresponding lead terminal 57 by a conductive wire 56 for electrical connection to an external circuit or a like member. On the other hand, the conductive wires 52 connected to the rear electrode 28 are connected to the connecting electrode part 55 integrally formed with lead terminals 59. Thereby, the rear electrode 28 is also electrically connected to the external circuit or the like member by the lead terminals 59.

Figure 12:
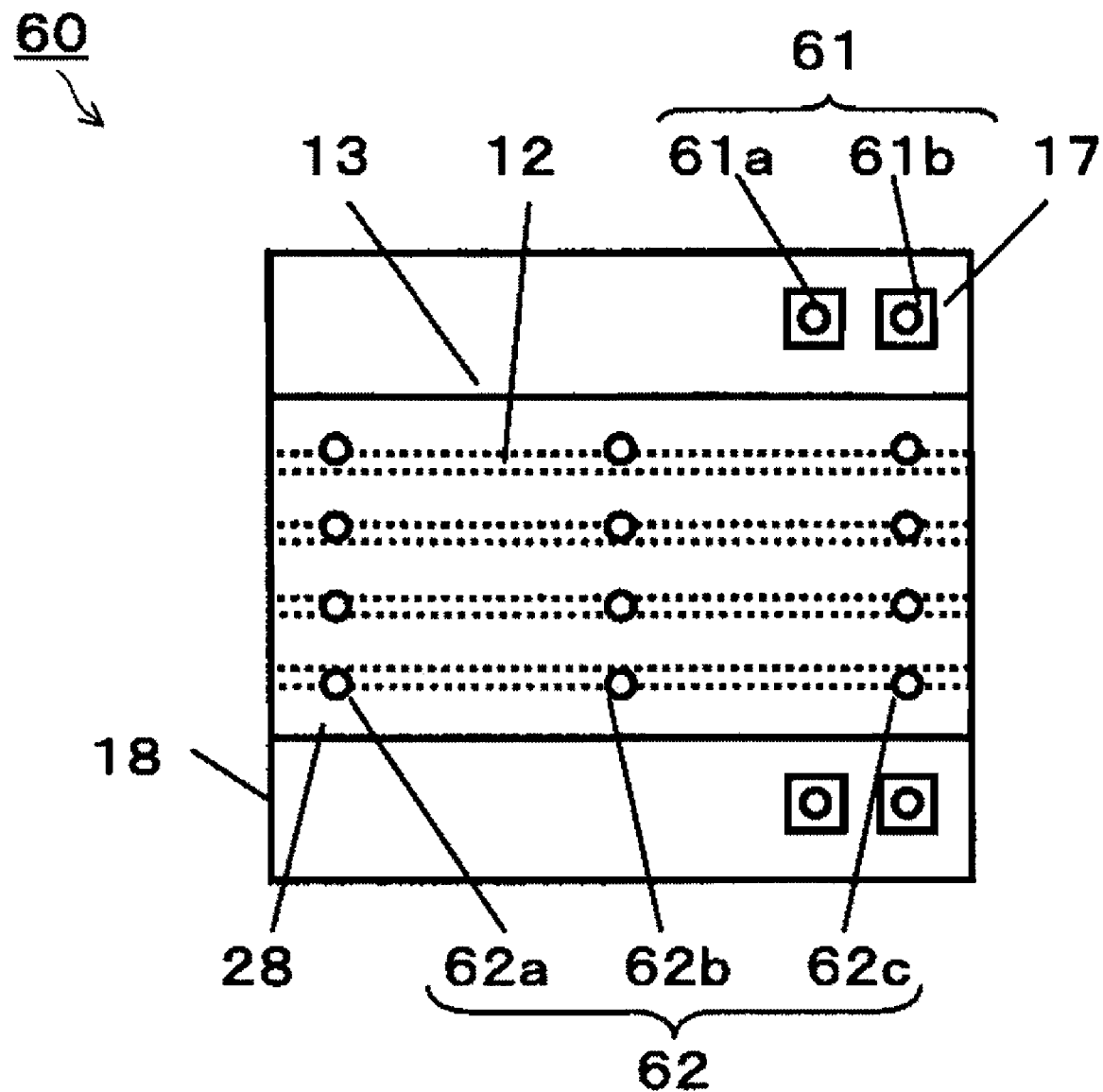
FIG. 12 is a plan view schematically showing a semiconductor laser device as a modification of the third embodiment.

In the following, a semiconductor laser device as a modification of the third embodiment is described. FIG. 12 is a plan view schematically showing a semiconductor laser device 60 as the modification of the third embodiment. The semiconductor laser device 60 shown in FIG. 12 is constructed in such a manner that bumps 61 are formed on electrode parts 17, and bumps 62 are formed on a rear electrode 28 of a semiconductor laser element 13, in place of the conductive wires 56 to be used in electrical connection of the electrode parts 17 to the connecting electrode parts 58, and the conductive wires 52 to be used in electrical connection of the rear electrode 28 to the connecting electrode part 55, as shown in FIG. 11. In the modification, the electrode parts 17 are electrically connected to connecting electrode parts 58, and the rear electrode 28 is electrically connected to a connecting electrode part 55, without using the conductive wires 52. The bumps 61 are individually formed on the electrode parts 17, as bumps 61a and 61b. The bumps 62 are formed at three sites along a corresponding active region 12 i.e. at both ends and a middle portion of the active region 12, as bumps 62a, 62b, and 62c.

Figure 13:
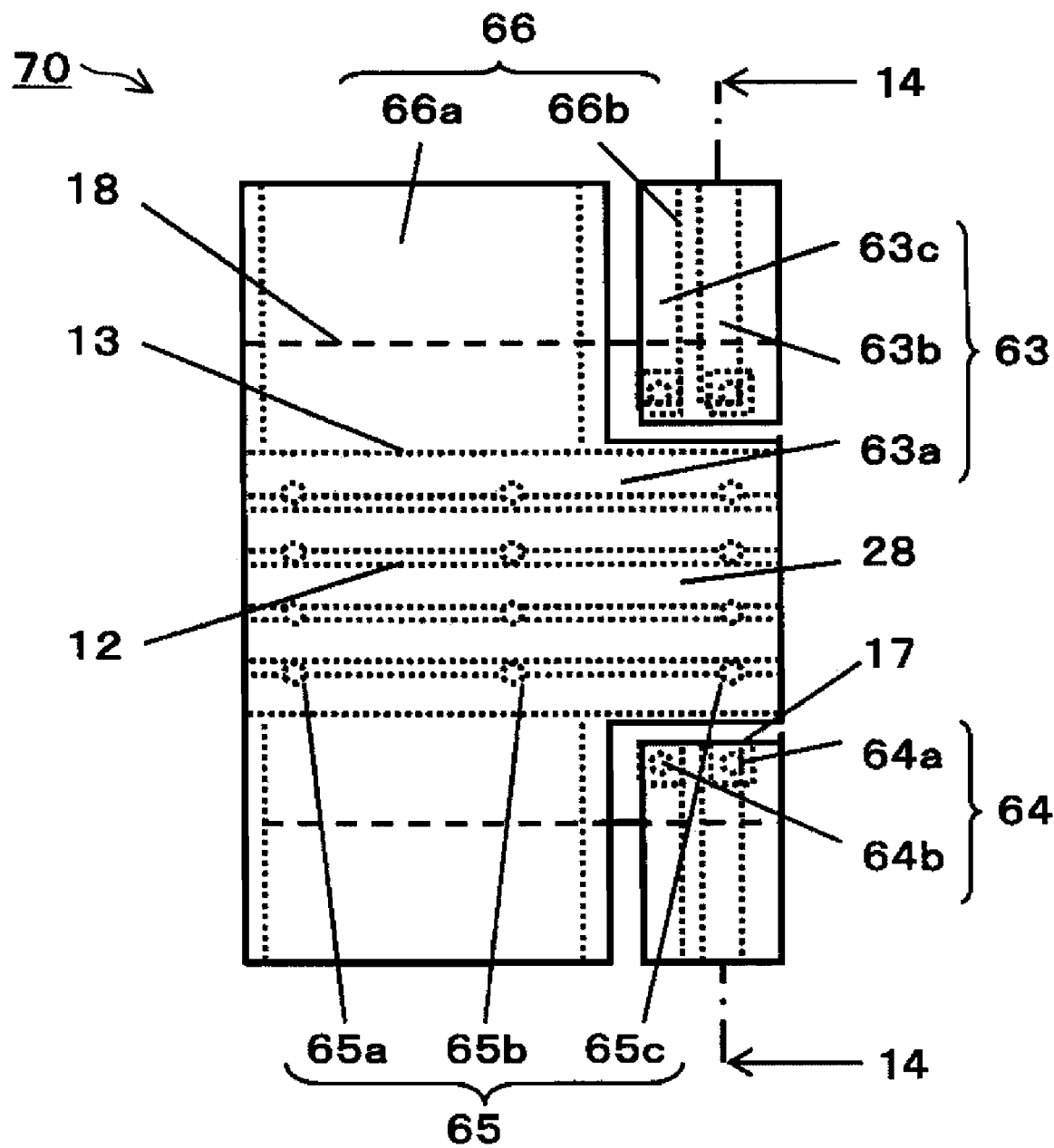
FIG. 13 is a plan view of a semiconductor laser device as another modification of the third embodiment, schematically showing that a circuit board formed with bumps is electrically connected to a semiconductor laser element and a substrate.
Figure 14:
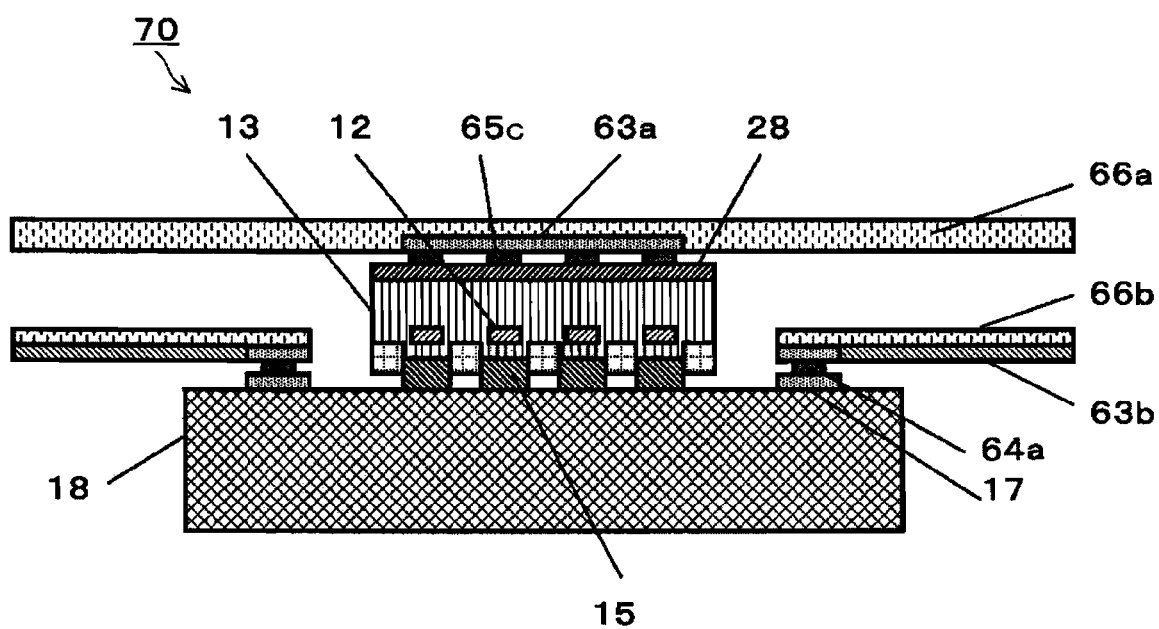
FIG. 14 is a cross-sectional view, taken along the line 14-14 in FIG. 13, schematically showing the semiconductor laser device.

FIG. 13 is a plan view of another modification of the third embodiment, schematically showing a semiconductor laser device 70 constructed in such a manner that a circuit board formed with bumps is electrically connected to a semiconductor laser element and a substrate. FIG. 14 is a cross-sectional view, taken along the line 14-14 in FIG. 13, schematically showing the semiconductor laser device 70.

As shown in FIG. 13, the semiconductor laser device 70 includes a semiconductor laser element 13, a base block 18 internally formed with wirings, and circuit boards 66 (66a, 66b) having substrate electrode parts 63 (63a, 63b, 63c) to be connected to a power source or a like member. Bumps 64 (64a, 64b) are formed on the substrate electrode parts 63b and 63c opposing to electrode parts 17, respectively. The substrate electrode parts 63b and 63c are electrically connected to the electrode parts 17 by the bumps 64a and 64b, respectively. As shown in FIG. 13, bumps 65 (65a, 65b, 65c) are formed at three sites on the substrate electrode part 63a opposing to a rear electrode 28 i.e. at both ends and the middle portion of the substrate electrode part 63a along a corresponding active region 12. The substrate electrode part 63a is electrically connected to the rear electrode 28 by the bumps 65a, 65b, and 65c. In this arrangement, the circuit boards 66 are electrically connected to the rear electrode 28 of the semiconductor laser device 70 and the electrode parts 17 on the base block 18 with use of the bumps 62, in place of the conductive wires.

As shown in FIG. 13, the circuit boards 66 may be individual circuit boards i.e. the circuit board 66a to be connected to the rear electrode 28, and the circuit board 66b to be connected to the electrode parts 17. The electrode parts 17 are connected to the substrate electrode parts 63b and 63c by wiring, and the rear electrode 28 is connected to the substrate electrode part 63a by wiring.

The bumps 65 are formed on the substrate electrode part 63a at three sites i.e. at both ends and the middle portion of the substrate electrode part 63a along the corresponding active region 12, as the bumps 65a, 65b, and 65c. The bumps 65a, 65b, and 65c are formed at positions opposing to a corresponding laser electrode with respect to the active region 12. As shown in FIG. 13, the bumps 65 are formed on the rear electrode 28 with a matrix pattern. By the matrix pattern formation, a part of the substrate electrode part 63a on the circuit board 66 is electrically connected to the rear electrode 28 by the bumps 65. This enables to efficiently discharge the electric current supplied to the semiconductor laser element 13 from the rear electrode 28 without local discharge of the electric current from a specific site of the active regions 12.

As described above, the electrode parts 17 can be connected to the other circuit board or a like member via the substrate electrode parts 63 without using the conductive wires. This enables to operate the semiconductor laser device 70 at a high-output laser power by supplying a large electric current, while securing miniaturization and high reliability of the semiconductor laser device 70.

FIG. 14 is a cross-sectional view, taken along the line 14-14 in FIG. 13, schematically showing the semiconductor laser device 70. As is obvious from FIG. 14, the bump 64a formed on the substrate electrode part 63b of the circuit board 66b is electrically connected to the corresponding electrode part 17 formed on left and right sides of the base block 18 with small dimensions. Similarly, the bump 65c formed on the substrate electrode part 63a of the circuit board 66a is electrically connected to the rear electrode 28 formed in the vicinity of an upper portion of the active regions 12 with small dimensions. In FIG. 14, illustration on wirings, inside the base block 18, for connecting the laser electrodes 15 to the electrode parts 17, is omitted.

Similarly to the semiconductor laser device described in the first embodiment, in the semiconductor laser device 70 having the above arrangement, a supplied electric current is efficiently converted into high-output laser beams. Accordingly, the semiconductor laser device 70 can be operated at a low-consumption current and a low-consumption electric power.

In the second and the third embodiments, the semiconductor laser device is described by taking an example of an AlGaInP-based red semiconductor laser device for emitting laser beams of 640 nm wavelength. Alternatively, it is possible to use a semiconductor laser device with an output wavelength different from that of the aforementioned semiconductor laser device, or using a material different from the material of the aforementioned semiconductor laser device. For instance, as far as the semiconductor laser device is used in an image display device such as a panel display device, various semiconductor laser devices including a GaN-based blue semiconductor laser device, and a multi-wavelength semiconductor laser device such as a dual wavelength semiconductor laser device may be used. It is needless to say that an infrared semiconductor laser device using a basic wave for use in green wavelength conversion is usable.

The infrared semiconductor laser device may be a semiconductor laser device for emitting laser beams of 800 nm-wavelength band, laser beams of 900 nm-wavelength band, and laser beams of 1,000 nm-wavelength band. For instance, the embodiment is applicable to an arrangement of converting a laser beam of 800 nm wavelength into a laser beam of 1,064 nm wavelength by pumping a solid-state laser for emitting a laser beam of 800 nm wavelength; converting a laser beam of 900 nm wavelength band into a laser beam of 1,060 nm wavelength by pumping a fiber laser for emitting a laser beam of 900 nm wavelength band; and oscillating a laser beam of 1,060 nm wavelength. Laser beams of a wavelength near 1,060 nm wavelength are subjected to wavelength conversion into green laser beams. The semiconductor laser device using a basic wave may preferably have an array structure including multiple active regions. In this sense, the arrangement of the third embodiment is advantageously used.

Fourth Embodiment

Figure 15:
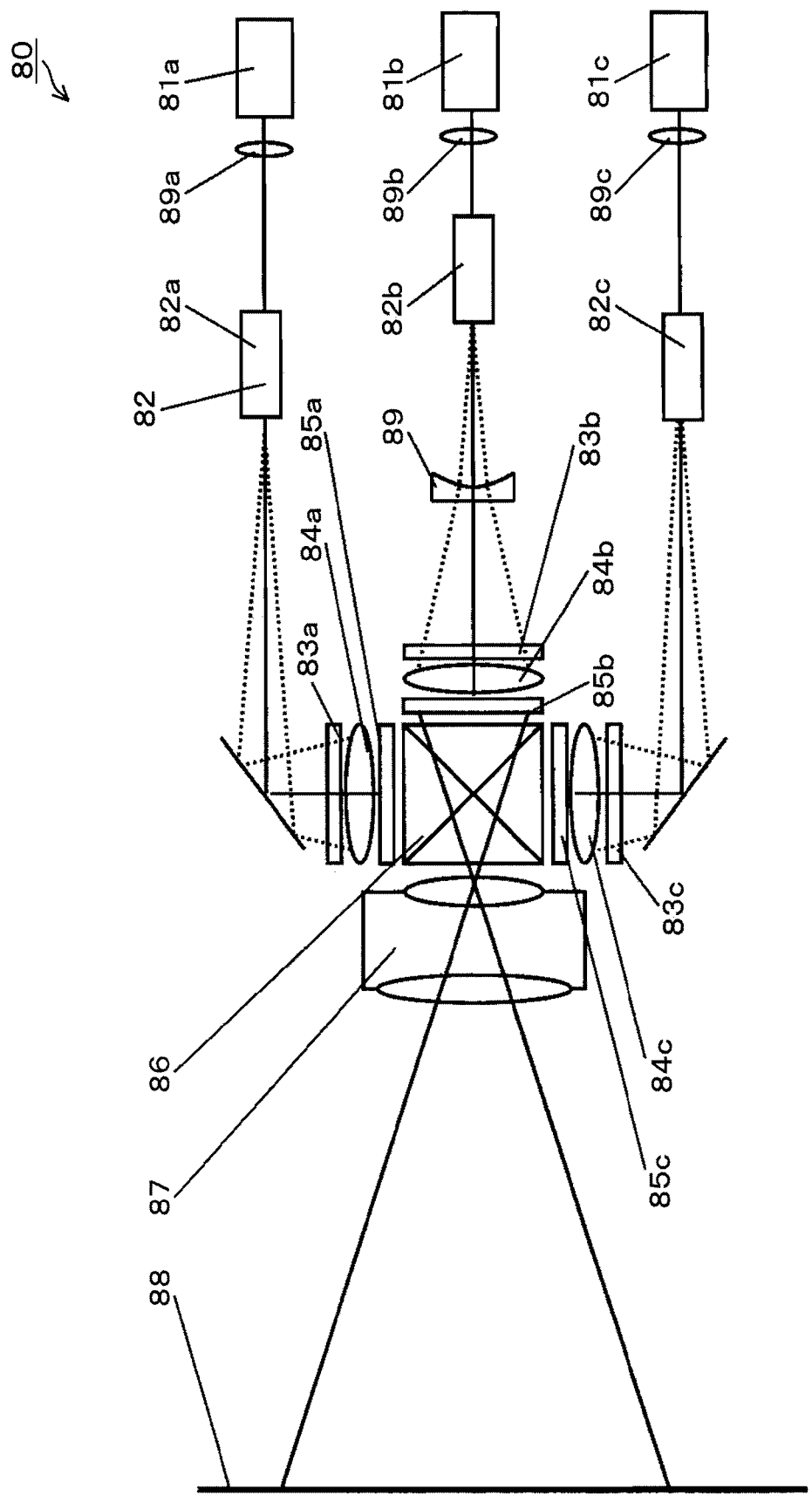
FIG. 15 is a diagram schematically showing an example of an arrangement of an image display device as a fourth embodiment of the invention.

FIG. 15 is a diagram schematically showing an example of an arrangement of an image display device as the fourth embodiment of the invention, to which the semiconductor laser device of the first, the second, or the third embodiment is applied. As a light source, there are provided laser light sources 81a, 81b, and 81c for emitting laser beams of three different colors of red (R), green (G), and blue (B). An AlGaInP/GaAs-based semiconductor laser device for emitting laser beams of 640 nm wavelength is used as the red laser light source (indicated by R light source in FIG. 15) 81a. A GaN-based semiconductor laser device for emitting laser beams of 450 nm wavelength is used as the blue laser light source (indicated by B light source in FIG. 15) 81c. A wavelength conversion device, equipped with a wavelength conversion element for converting the wavelength of an infrared laser beam into one-half of the original wavelength, for emitting laser beams of 530 nm wavelength, is used as the green laser light source (indicated by G light source in FIG. 15) 81b.

As shown in FIG. 15, an image display device 80 as the fourth embodiment includes the laser light sources 81a, 81b, and 81c, and reflective two-dimensional beam scanners 82a, 82b, and 82c for scanning the laser beams emitted from the laser light sources 81a, 81b, and 81c. The laser light sources 81a, 81b, and 81c emit at least red, green, and blue laser beams, respectively. At least one of the laser light source 81a for emitting red laser beams, and the laser light source 81c for emitting blue laser beams, out of the laser light sources 81a, 81b, and 81c, includes the semiconductor laser device of the first, the second, or the third embodiment. In this embodiment, the semiconductor laser device is used as the laser light source 81a for emitting red laser beams of 640 nm wavelength, and the laser light source 81c for emitting blue laser beams of 450 nm wavelength.

In the following, an arrangement of an optical system for forming an image with use of the laser light sources of the image display device 80 as the fourth embodiment is described. Laser beams of R, G, and B emitted from the laser light sources 81a, 81b, and 81c of the image display device 80 are condensed on condenser lenses 89a, 89b, and 89c, and then scanned on diffusers 83a, 83b, and 83c through the reflective two-dimensional beam scanners 82a, 82b, and 82c, respectively.

The laser beams diffused by the diffusers 83a, 83b, and 83c are incident onto space modulating elements 85a, 85b, and 85c after convergence on field lenses 84a, 84b, and 84c, respectively. Image data is divided into R data, G data, and B data, and the individual data are inputted to the space modulating elements 85a, 85b, and 85c, respectively. The laser beams modulated by the space modulating elements 85a, 85b, and 85c are synthesized into a color image by a dichroic prism 86. The synthesized color image is projected onto a screen 88 by a projection lens 87. There is provided a concave lens 89 on an optical path from the green laser light source 81b to the space modulating element 85b for making the spot size of a green laser beam on the space modulating element 85b substantially identical to the spot size of a red laser beam or a blue laser beam.

As described above, the image display device 80 of the fourth embodiment is advantageous, as compared with an arrangement of using an ordinary semiconductor laser device, in that the laser light sources are operated at a low-consumption current and a low-consumption electric power, and with a long operation life, by using the semiconductor laser device of the first, the second, or the third embodiment as the laser light sources. Thus, the image display device 80 can be advantageously operated at a low-consumption current and a low-consumption electric power, and with a long operation life.

Fifth Embodiment

Figure 16:
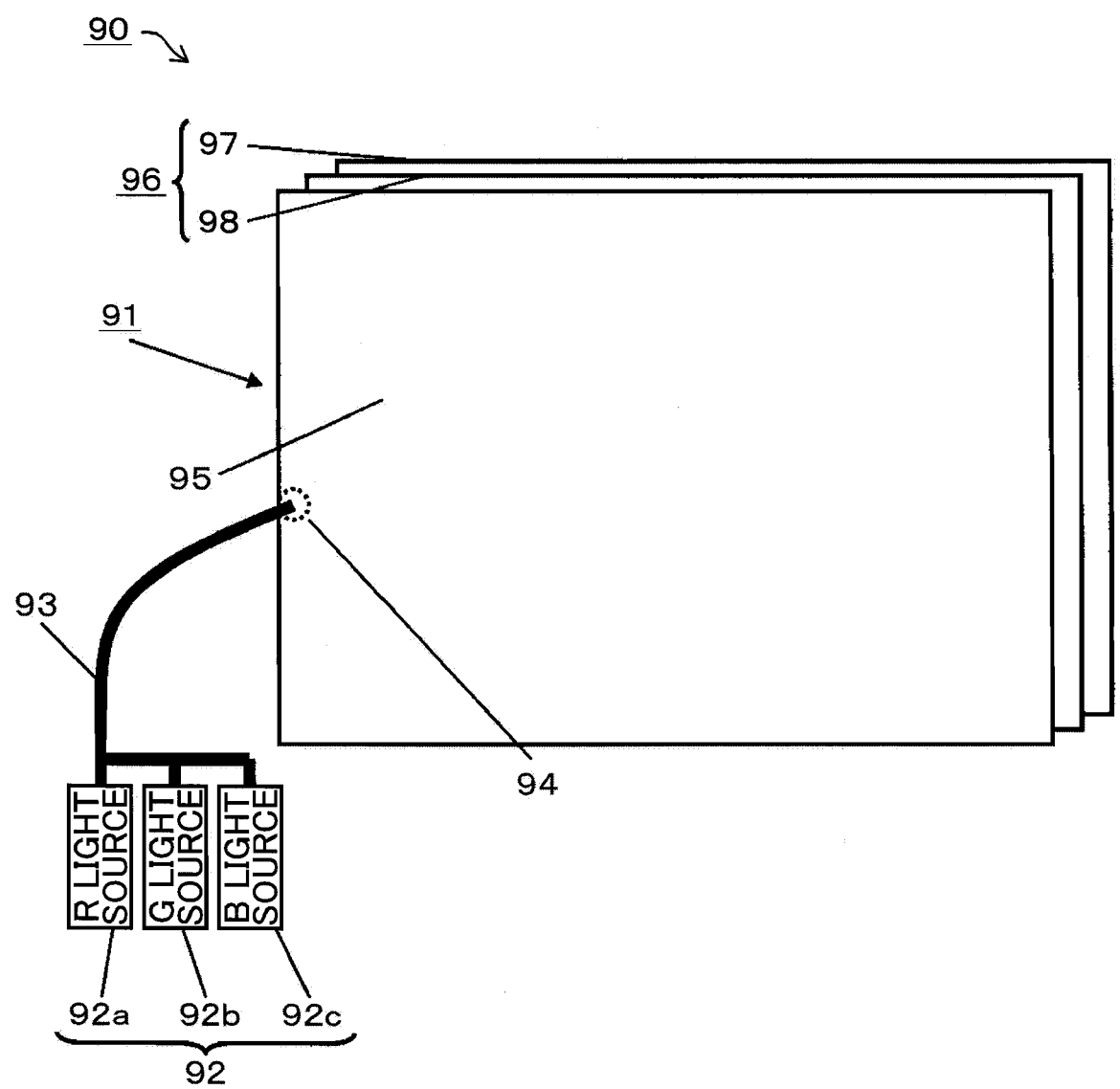
FIG. 16 is a diagram schematically showing an example of an arrangement of an image display device as a fifth embodiment of the invention.

FIG. 16 is a diagram schematically showing an example of an arrangement of an image display device as the fifth embodiment, to which a backlight illuminator incorporated with the semiconductor laser device of the first, the second, or the third embodiment is applied. FIG. 16 is a diagram schematically showing an arrangement of a liquid crystal display device 90, as an example of the image display device.

As shown in FIG. 16, the liquid crystal display device 90 includes a liquid crystal display panel 96, and a backlight illuminator 91 for illuminating the liquid crystal display panel 96 from the backside. The backlight illuminator 91 includes multiple laser light sources 92. The laser light sources 92 include light sources for emitting laser beams of at least red, green, and blue, respectively. Specifically, the laser light sources 92 are constituted of a red laser light source (indicated by the R light source in FIG. 16) 92a for emitting red laser beams, a green laser light source (indicated by G light source in FIG. 16) 92b for emitting green laser beams, and a blue laser light source (indicated by B light source in FIG. 16) 92c for emitting blue laser beams. At least one of the red laser light source 92a and the blue laser light source 92c out of the laser light sources 92 includes the semiconductor laser device of the first, the second, or the third embodiment.

In this embodiment, an AlGaInP/GaAs-based semiconductor laser device for emitting laser beams of 640 nm wavelength is used as the red laser light source 92a. A GaN-based semiconductor laser device for emitting laser beams of 450 nm wavelength is used as the blue laser light source 92c. A wavelength conversion device, equipped with a wavelength conversion element for converting the wavelength of an infrared laser beam into one-half of the original wavelength, for emitting laser beams of 530 nm wavelength is used as the green laser light source 92b.

In the following, the arrangement of the liquid crystal display device 90 of the fifth embodiment is further described. The liquid crystal display panel 96 includes a polarizing plate 97 for displaying an image by utilizing the red, green, and blue laser beams emitted from the backlight illuminator 91, and a liquid crystal plate 98. The backlight illuminator 91 of the fifth embodiment shown in FIG. 16 includes the laser light sources 92, an optical fiber 93 for collectively guiding the red, green, and blue laser beams from the laser light sources 92 to a light guiding plate 95 via a light guider 94, and the light guiding plate 95 for emitting red, green, and blue laser beams from a principal plane (not shown) where the red, green, and blue laser beams introduced from the light guider 94 and uniformly collected.

As described above, the liquid crystal display device 90 of the fifth embodiment is advantageous, as compared with an arrangement of using an ordinary semiconductor laser device, in that the laser light sources are operated at a low-consumption current and a low-consumption electric power, and with a long operation life, by using the semiconductor laser device of the first, the second, or the third embodiment as the laser light sources of the backlight illuminator 91. Thus, the image display device can be advantageously operated at a low-consumption current and a low-consumption electric power, and with a long operation life.

Sixth Embodiment

Figure 17:
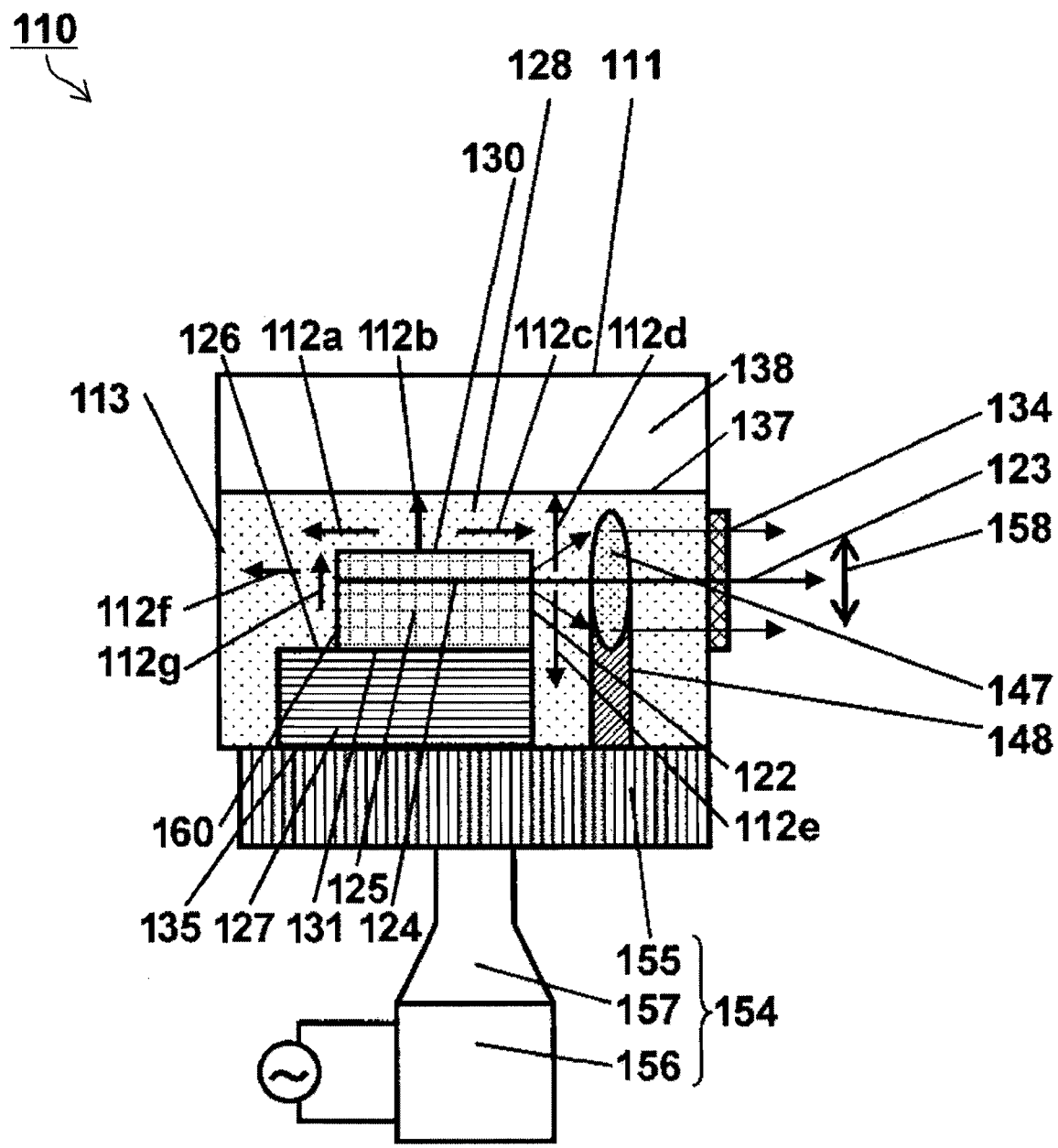
FIG. 17 is a diagram schematically showing an arrangement of a semiconductor laser device as a sixth embodiment of the invention.

FIG. 17 is a diagram schematically showing an arrangement of a semiconductor laser device as the sixth embodiment of the invention.

As shown in FIG. 17, a semiconductor laser device 100 as the sixth embodiment includes: a semiconductor laser element 125 having an active region 124 for emitting laser beams 123 from a front end surface 122 of the semiconductor laser element 125; a base block 127 having an upper surface 126 on which the semiconductor laser element 125 is mounted, with a first surface 130 of the semiconductor laser element 125 close to the active region 124 of the semiconductor laser element 125 being oriented upward, and a second surface 131 of the semiconductor laser element 125 opposing to the first surface 130 being oriented downward; and a container 111 for housing the semiconductor laser element 125 and the base block 127. The container 111 contains therein an insulating and transparent liquid 128 having a property of transmitting the laser beams 123. The base block 127 mounted with the semiconductor laser element 125 is disposed on a bottom portion 135 of the container 111 in such a manner that the first surface 130 of the semiconductor laser element 125 is immersed in the liquid 128. The container 111 has at least an area for emitting the laser beams 123, and the area is made of a transparent member 134 having a property of transmitting the laser beams 123. A space 138 is defined between a liquid surface 137 of the liquid 128 contained in the container 111, and a top surface of the container 111.

In the semiconductor laser device 100 having the above arrangement, the liquid 128 is allowed to move from a position on the first surface 130 of the semiconductor laser element 125 and a position adjacent the front end surface 122 of the semiconductor laser element 125 in the directions indicated by the arrows 112a, 112b, 112c, 112d, and 112e to cool the active region 124. Specifically, a heat generated in the active region 124 and the front end surface 122 is transferred to a part of the liquid 128 in the vicinity of the active region 124 and the front end surface 122, and the part of the liquid 128 whose temperature has been increased is diffusively moved in the directions indicated by the arrows 112a, 112b, 112c, 112d, and 112e by thermal expansion or a like phenomenon. Similarly to the above operation concerning the front end surface 122, a heat generated in a rear end surface 160 of the semiconductor laser element 125 is transferred to a part of the liquid 128 in the vicinity of the rear end surface 160, and the part of the liquid 128 whose temperature has been increased is diffusively moved in the directions indicated by the arrows 112f and 112g to cool the active region 124. The laser beams 123 as output beams from the semiconductor laser device 100 are transmitted through an optical component 147 supported on a support member 148, and emitted from the transparent member 134 attached to the container 111.

In the above arrangement, after the heat is transferred to the liquid 128 from the front end surface 122 and the active region 124 of the semiconductor laser element 125, the liquid 128 is moved within the container 111 where the semiconductor laser element 125 is mounted. As the liquid 128 is moved, at least a part of the liquid 128 is subjected to thermal circulation. Accordingly, the front end surface 122 and the active region 124 of the semiconductor laser element 125 are continuously and efficiently cooled to thereby suppress a temperature rise of the semiconductor laser element 125. In this way, the semiconductor laser device 100 can be operated at a low-consumption current and a low-consumption electric power, and with a watt-class high-output performance.

As shown in FIG. 17, the semiconductor laser device 100 includes an oscillation mechanism 154 for applying oscillations to the container 111. The oscillation mechanism 154 oscillates the semiconductor laser element 125 and the liquid 128. Thereby, the heat generated in the active region 124 is efficiently released. Specifically, the container 111 is mounted on an oscillation block 155 of the oscillation mechanism 154. An ultrasonic oscillator 156 generates ultrasonic waves. The ultrasonic waves generated by the ultrasonic oscillator 156 are transmitted to the oscillation block 155 by an ultrasonic horn 157. As the semiconductor laser element 125 and the liquid 128 in the container 111 are oscillated by the ultrasonic waves, the heat generated in the active region 124 is efficiently released, while using the liquid 128 as a medium. Since the space 138 is defined in the upper portion of the container 111, the liquid 128 is easily moved by application of the ultrasonic waves, thereby efficiently releasing the heat.

As described above, the heat generated in the semiconductor laser element 125 can be rapidly released by oscillating the liquid 128. Accordingly, the semiconductor laser device 100 can be operated at a low-consumption current and a low-consumption electric power, and with a watt-class high-output performance. Also, by oscillating the semiconductor laser element 125, the emission positions of the laser beams 123, as output beams, from the semiconductor laser device 100, are changed back and forth in the directions shown by the arrows 158, with time. This is advantageous in reducing speckle noises, which may be generated in the case where the semiconductor laser device 100 is used as a light source of an image display device or a like device.

Preferably, the oscillating frequency for oscillating the semiconductor laser device 100 is 60 Hz or more. A response speed of a human eye is several milliseconds. Accordingly, in the case where an object is oscillated at a speed higher than the response speed of the human eye, individuals cannot sense a change of an image by oscillation, and see the image as an averaged image. In view of this, speckle noises can be more efficiently suppressed by oscillating the semiconductor laser device 100 at 60 Hz or more. The oscillating waveform may be any one of a triangular waveform, a sinusoidal waveform, and a rectangular waveform.

Alternatively, a heat-releasing fin (not shown) may be attached to an outer wall 113 of the container 111 to cool the container 111 from the outside, in place of the above oscillation arrangement. Further alternatively, a peltier element (not shown) may be attached to the outer wall 113 of the container 111 to cool the container 111. In the modifications, the heat generated in the active region 124, the front end surface 122, and the rear end surface 160 is more rapidly moved, and a part of the liquid 128 is easily subjected to thermal circulation. Thereby, the active region 124, the front end surface 122, and the rear end surface 160 can be more efficiently and more rapidly cooled. A cooling device such as the oscillating mechanism 154, the heat-releasing fin, and the peltier element may be jointly used.

In the sixth embodiment, the space 138 is defined. Alternatively, the embodiment is applicable to a case where the liquid is substantially filled in the container 111 without the space 138.

Figure 18:
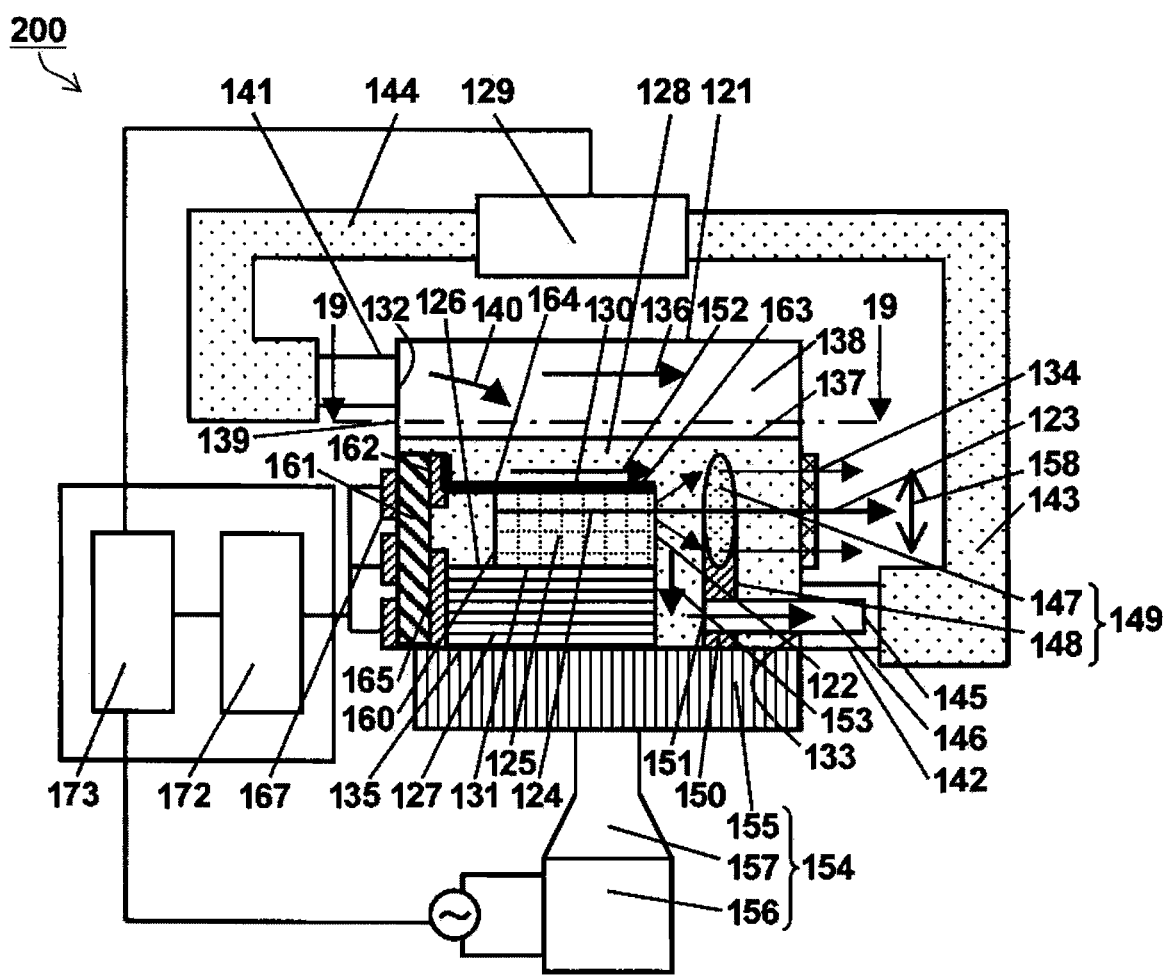
FIG. 18 is a diagram schematically showing primary parts of a semiconductor laser device as a modification of the sixth embodiment.
Figure 19:
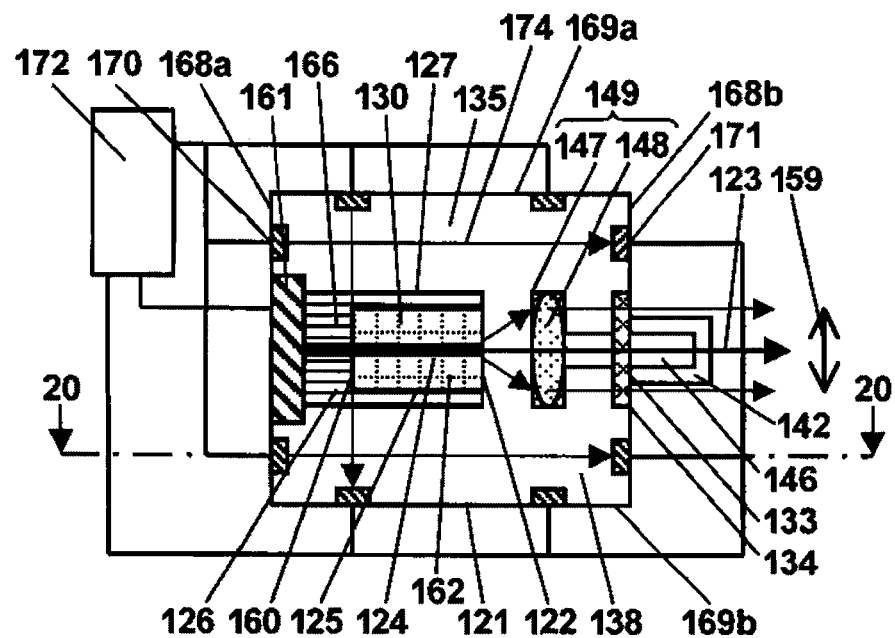
FIG. 19 is a diagram, viewed from the line 19-19 in FIG. 18, schematically showing primary parts of a container without containing a liquid.
Figure 20:
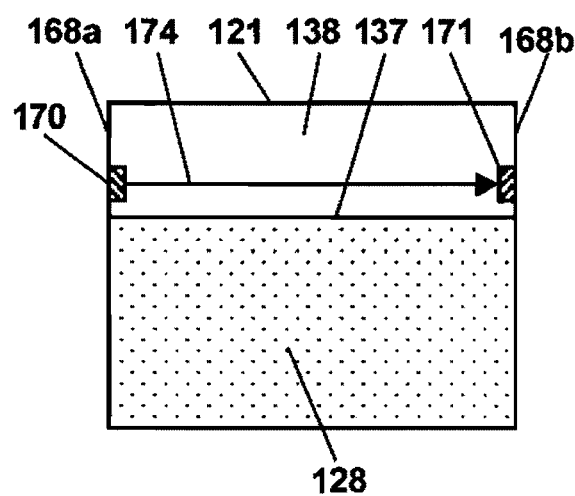
FIG. 20 is a cross-sectional view, taken along the line 20-20 in FIG. 19, schematically showing the primary parts of the container.

FIGS. 18 through 20 are diagrams schematically showing an arrangement of a semiconductor laser device with an improved cooling efficiency, as a modification of the sixth embodiment, as compared with the arrangement shown in FIG. 17. FIG. 18 is a diagram schematically showing primary parts of a semiconductor laser device 200 as the modification of the sixth embodiment. FIG. 19 is a diagram, viewed from the line 19-19 in FIG. 18, schematically showing primary parts of a container 121 without containing a liquid. FIG. 20 is a cross-sectional view, taken along the line 20-20 in FIG. 19, schematically showing the primary parts of the container 121.

The semiconductor laser device 200 shown in FIG. 18 as the modification of the sixth embodiment includes: a semiconductor laser element 125 having an active region 124 for emitting laser beams 123 from a front end surface 122; a base block 127 having an upper surface 126 on which the semiconductor laser element 125 is mounted; the container 121 for housing the semiconductor laser element 125 and the base block 127; and a pump 129 for drawing a liquid 128 into the container 121 and discharging the liquid 128 from the container 121.

The semiconductor laser element 125 is mounted on the upper surface 126 of the base block 127, with a first surface 130 of the semiconductor laser element 125 close to the active region 124 of the semiconductor laser element 125 being oriented upward, and a second surface 131 of the semiconductor laser element 125 opposing to the first surface 130 being oriented downward. The container 121 contains therein an insulating and transparent liquid 128 having a property of transmitting the laser beams 123. The container 121 has an inlet port 132 for drawing the liquid 128 into the container 121, and an outlet port 133 for discharging the liquid 128 from the container 121. The container 121 has at least an area for emitting the laser beams 123, and the area is made of a transparent member 134 having a property of transmitting the laser beams 123.

The pump 129 is activated to draw the liquid 128 into the container 121 through the inlet port 132, and discharge the liquid 128 from the container 121 through the outlet port 133 to cause circulation of the liquid 128 within the container 121. Specifically, unlike the semiconductor laser device 100, the semiconductor laser device 200 has the pump 129 for circulating the liquid 128, and a circulation route along which the liquid 128 is circulated.

In the semiconductor laser device 200 having the above arrangement, the base block 127 mounted with the semiconductor laser element 125 is disposed on a bottom portion 135 of the container 121 in such a manner that the first surface 130 of the semiconductor laser element 125 is immersed in the liquid 128. In this arrangement, at least a part of the liquid 128 is allowed to flow on the first surface 130 along an optical axis direction 136 of the semiconductor laser element 125, and along the front end surface 122 of the semiconductor laser element 125 to efficiently cool the active region 124. In the sixth embodiment, since the first surface 130 close to the active region 124 of the semiconductor laser element 125 is oriented upward, a larger cooling effect can be obtained.

In the above arrangement, the liquid 128 is allowed to flow in the container 121 where the semiconductor laser element 125 is mounted to efficiently cool the front end surface 122 and the active region 124 of the semiconductor laser element 125, thereby suppressing a temperature rise of the semiconductor laser element 125. This enables to operate the semiconductor laser device 200 at a low-consumption current and a low-consumption electric power, and with a watt-class high-output performance.

In the following, the arrangement of the semiconductor laser device 200 is described in detail referring to FIGS. 18 through 20.

As shown in FIG. 18, the semiconductor laser device 200 has the space 138 between the liquid surface 137 of the liquid 128 contained in the container 121, and the top surface of the container 121. In this arrangement, in the case where the semiconductor laser device 200 is tilted by e.g. tipping over, the liquid surface 137 of the liquid 128 can be shifted. As will be described later, by detecting a shift of the liquid surface 137 with use of e.g. a pair of a light emitter and a light receiver, the paired light emitter and light receiver can be used as a switch for suspending an operation of the semiconductor laser device 200 for safety measures in emergency shutdown. Further, forming the inlet port 132 for drawing the liquid 128 into the container 121 at an appropriate position on the upper portion of the container 121 is advantageous in directly and rapidly supplying the liquid 128 as a coolant to the vicinity of the active region 124 of the semiconductor laser element 125 at a position away from a side wall 139, as shown by the arrow 140. This enables to efficiently cool the active region 124.

The liquid 128 is drawn into the container 121 through the inlet port 132 of the container 121 from a drawing pipe 141 connected to the inlet port 132, as shown by the arrow 140. Thereby, the active region 124 of the semiconductor laser element 125 immersed in the liquid 128 in the container 121 is efficiently cooled. After the cooling, the liquid 128 is drawn from the container 121 through the outlet port 133 into a discharging pipe 142 connected to the outlet port 133. Upon reaching the pump 129 by way of a pipe 143 connected to the pump 129, the discharged liquid 128 is refluxed into a pipe 144 by the pump 129 to be drawn into the container 121 again through the inlet port 132. The pump 129 is functioned to cool the liquid 128 flowing in the pump 129 to a predetermined temperature, as well as circulating the liquid 128 in the pipes 143 and 144, and the container 121.

As shown in FIG. 18, the semiconductor laser device 200 includes a partial discharging pipe 146, the optical component 147, and the support member 148 to efficiently cool the active region 124. The partial discharging pipe 146 is disposed on the bottom portion 135 of the container 121, and has one end 145 thereof directly communicated with the outlet port 133. The optical component 147 is opposed to the front end surface 122 of the semiconductor laser element 125 and is disposed perpendicular to the laser beams 123. The support member 148 is disposed on the bottom portion 135 to support the optical component 147. A flow regulator 149 for regulating the flow of the liquid 128 is constituted of the optical component 147 and the support member 148. The support member 148 is mounted on the bottom portion 135 in such a manner that the other end 151 of the partial discharging pipe 146 is directly communicated with a through-hole 150 formed in a part of the bottom portion 135 to discharge the liquid 128 through the other end 151 of the partial discharging pipe 146.

In the above arrangement, the speed of the liquid 128 flowing from the front end surface 122 toward the partial discharging pipe 146 while flowing on the first surface 130 along the optical axis direction 136 of the semiconductor laser element 125 can be set higher than the speed of the liquid 128 flowing on the other portions of the container 121. Specifically, the liquid 128 flowing in the direction of the arrow 152 close to the active region 124 flows at a speed higher than the speed of the liquid 128 flowing on the other portions of the container 121. The liquid 128 continuously flows at the higher speed downwardly along the front end surface 122 in the direction of the arrow 153, and then is drawn from the container 121 through the outlet port 133 of the container 121 via the partial discharging pipe 146.

In the above arrangement, the heat generated in the semiconductor laser element 125 is further rapidly transferred to the liquid 128. This enables to operate the semiconductor laser device 200 at a low-consumption current and a low-consumption electric power, and with a watt-class high-output performance.

As shown in FIG. 18, the semiconductor laser device 200 further includes an oscillation mechanism 154 for applying oscillations to the container 121. The oscillation mechanism 154 oscillates the semiconductor laser element 125 and the liquid 128. Thereby, the heat generated in the active region 124 is efficiently released. Specifically, the container 121 is mounted on an oscillation block 155 of the oscillation mechanism 154. An ultrasonic oscillator 156 generates ultrasonic waves. The ultrasonic waves generated by the ultrasonic oscillator 156 are transmitted to the oscillation block 155 by an ultrasonic horn 157. As the semiconductor laser element 125 and the liquid 128 in the container 121 are oscillated by the ultrasonic waves, the heat generated in the active region 124 is efficiently released, while using the liquid 128 as a medium. Since the space 138 is defined in the upper portion of the container 121, the liquid 128 is easily moved by application of the ultrasonic waves, thereby efficiently releasing the heat.

Thus, the heat generated in the semiconductor laser element 125 can be rapidly released therefrom by oscillating the liquid 128. Accordingly, the semiconductor laser device 200 can be operated at a low-consumption current and a low-consumption electric power, and with a watt-class high-output performance. Also, by oscillating the semiconductor laser element 125, the emission positions of the laser beams 123, as output beams, from the semiconductor laser device 200, are changed back and forth in the directions shown by the arrows 158 in FIG. 18 or the arrows 159 in FIG. 19, with time. This is advantageous in reducing speckle noises, which may be generated in the case where the semiconductor laser device 200 is used as a light source of an image display device or a like device.

The semiconductor laser device 200 as the modification of the sixth embodiment has the following feature concerning electrical connection, in addition to the above. Specifically, the semiconductor laser device 200 further includes a wiring substrate 161 disposed on a the side wall 139 formed at a rear end of the container 121, opposing to the rear end surface 160 of the semiconductor laser element 125. A laser wiring electrode 162 formed on the wiring substrate 161, and a laser electrode 163 formed on the first surface 130 of the semiconductor laser element 125 are electrically connected to each other by a conductive member 164. Similarly, a rear electrode (not shown) formed on the second surface 131 of the semiconductor laser element 125 is electrically connected to a laser wiring electrode 165 of the wiring substrate 161 via a base block electrode 166 formed on the base block 127. The conductive member 164 to be used in the electrical connection may be e.g. a rod-like metal wire or a metal plate, which is free of deformation in the liquid flow, in place of a conductive wire for wire bonding, which is ordinarily used in a semiconductor element. The wiring substrate 161 connected in the aforementioned manner is electrically connected to the outside of the container 121 by a connecting electrode 167.

In the above arrangement, even if the semiconductor laser element 125 is immersed in the liquid 128, the laser electrode 163 formed on the first surface 130 of the semiconductor laser element 125 can be electrically connected to the laser wiring electrode 165 of the wiring substrate 161 with high reliability.

As shown in FIGS. 18 and 19, at least one of the transparent member 134 for transmitting the laser beams 123, and the optical component 147 includes a lens for condensing the laser beams 123. The lens is made of an optical material having a refractive index in the range from 1.6 to 2.6. For instance, an aluminum oxide having a refractive index from 1.6 to 1.8, SF-2 glass having a refractive index of 1.64, or a titanium oxide having a refractive index of 2.52 may be used as a material for the lens. In the modification of the sixth embodiment, the transparent member 134 provided near the front end surface 122 of the semiconductor laser element 125 is a convex lens. Using the convex lens is advantageous in efficiently condensing the laser beams onto the lens in a condition that the semiconductor laser element 125 is immersed in the liquid. This enables to further efficiently operate the semiconductor laser device 200 to output high-output laser beams.

The semiconductor laser device 200 as the modification of the sixth embodiment is safety-oriented, in addition to the above features. For safety measures, the semiconductor laser device 200 includes a light emitter 170 disposed on one inner side wall of the container 121, a light receiver 171 disposed on the other inner side wall of the container 121 at a position opposing to the light emitter 170, and a controller 173 for controlling at least the semiconductor laser element 125, the light emitter 170 and the light receiver 171. The paired light emitter 170 and light receiver 171 is provided on a pair of side walls 168a and 168b of the container 121 opposing to each other, and a pair of side walls 169a and 169b of the container 121 opposing to each other.

As shown in FIG. 20, the light emitter 170 and the light receiver 171 are disposed as opposed to each other with respect to the space 138 defined in the upper portion of the liquid surface 137. The controller 173 detects a change in received light amount resulting from covering at least a part of one of the light emitter 170 and the light receiver 171 with the liquid 128. In the case where a change in received light amount is detected, the controller 173 controls the semiconductor laser element 125 to suspend an operation thereof.

Output control of the laser beams 123, output control of a signal beam 174 to be emitted from the light emitter 170, and signal control in accordance with the received light amount of the light receiver 171 are directly performed by a power source section 172. Specifically, the semiconductor laser element 125, the light emitter 170, and the light receiver 171 are electrically connected to the controller 173 by wiring to be integrally controlled with the other components of the semiconductor laser device 200. As shown in FIG. 18, since the pump 129 and the oscillation mechanism 154 are electrically connected to the controller 173 by wiring, the overall operation of the semiconductor laser device 200 is controlled by the controller 173.

In the above arrangement, the semiconductor laser device 200 can be safely used, even if the semiconductor laser device 200 is individually incorporated in an electronic device or a like device.

Figure 21A:
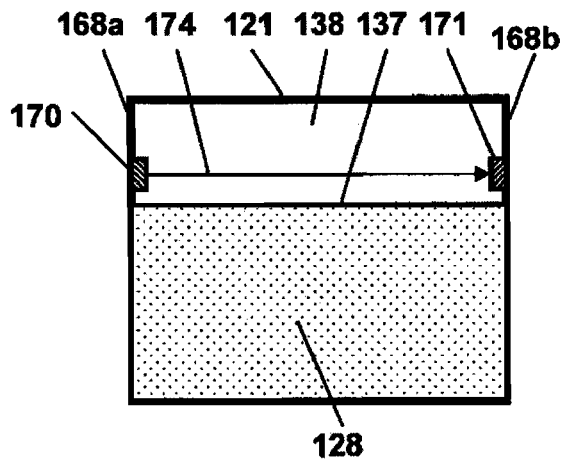
FIGS. 21A through 21C are diagrams for describing a safety-oriented arrangement of the semiconductor laser device as the sixth embodiment of the invention.
Figure 21B:
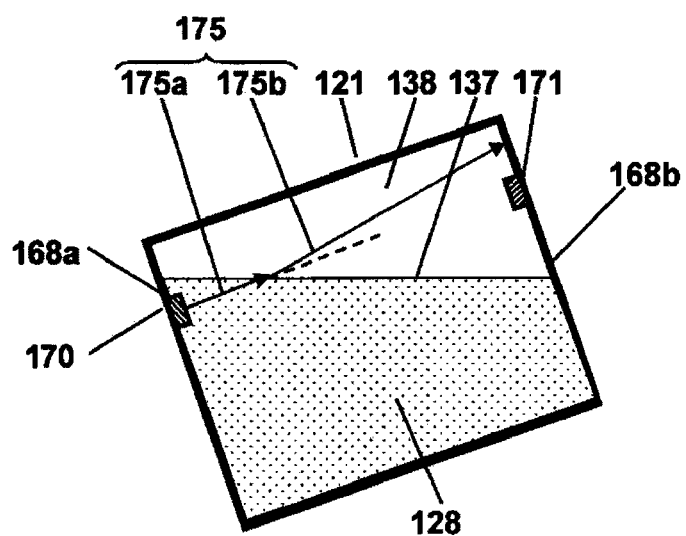
Figure 21C:
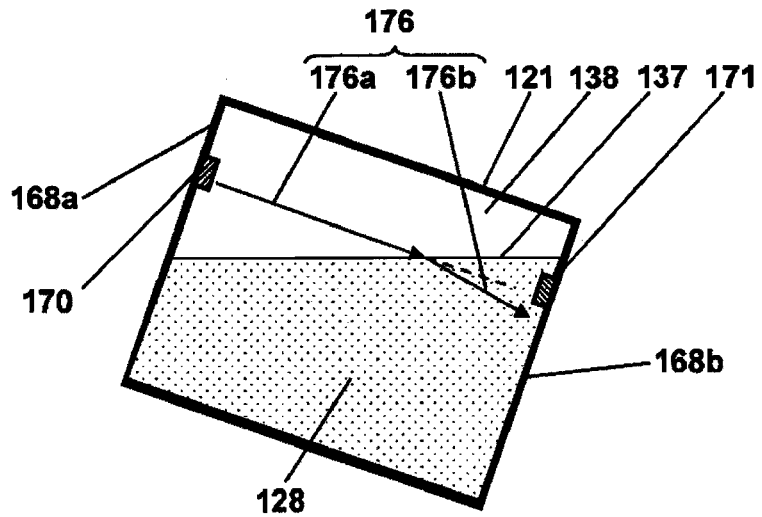

FIGS. 21A through 21C are schematic diagrams for describing a safety-oriented arrangement of the semiconductor laser device 100 or 200 in the sixth embodiment. FIGS. 21A through 21C illustrate merely the parts of the semiconductor laser device 100 or 200 relating to safety measures. In the following, description is made by taking an example of the semiconductor laser device 200.

FIG. 21A is a diagram substantially equivalent to FIG. 20, showing positional relations between the container 121, the liquid surface 137 of the liquid 128, and the paired light emitter 170 and light receiver 171 disposed above the liquid surface 137 in a state that the semiconductor laser device 200 is not tilted. In this condition, the signal beam 174 emitted from the light emitter 170 propagates through the space 138 in the container 121, and is detected by the light receiver 171.

In the following, description is made on a case where the semiconductor laser device 200 is tilted, in other words, the container 121 is inclined. For simplifying the description, a case is described, in which the container 121 in the state of FIG. 21A is inclined leftwardly downward.

FIG. 21B is a diagram showing a positional change of the liquid surface 137, a signal beam 175 (175a, 175b), and the paired light emitter 170 and light receiver 171 in the case where the container 121 in the state of FIG. 21A is inclined leftwardly downward. Even if the container 121 is inclined, the liquid surface 137 retains its horizontal state because the space 138 is defined in the container 121. The light emitter 170 is immersed below the liquid surface 137, while being covered by the liquid 128. In this state, if the signal beam 175a is emitted from the light emitter 170, the signal beam 175a is bent into the signal beam 175b with respect to the direction shown by the broken-line due to a difference in refractive index between the liquid 128 and the air in the space 138. As a result, the signal beam 175b is not detected by the light receiver 171, or merely a part of the signal beam 175b is detected by the light receiver 171, with the result that the light amount received by the light receiver 171 is reduced, as compared with the state of FIG. 21A. In the case where a part of the light emitter 170 is covered by the liquid 128, the signal beam 175a is scattered, with the result that the light amount of the signal beam 175 received by the light receiver 171 is reduced.

FIG. 21C is a diagram showing a positional change of the liquid surface 137, a signal beam 176 (176a, 176b), and the paired light emitter 170 and light receiver 171 in the case where the container 121 in the state of FIG. 21A is inclined rightwardly downward. Similarly to the above described referring to FIG. 21B, the signal beam 176a is bent on the liquid surface 137 by a difference in refractive index between the liquid 128 and the air in the space 138. As a result, the light amount of the signal beam 176b received by the light receiver 171 is reduced, as compared with the state of FIG. 21A.

As described above, in the case where the semiconductor laser device 200 is tilted by e.g. tipping over, the above arrangement enables to detect a tilted state by a change in light amount received by the light receiver 171. This enables to suspend the operation of the semiconductor laser device 200, thereby providing safety measures.

In the case where the oscillation mechanism 154 for oscillating the container 121, and the paired light emitter 170 and light receiver 171 for detecting a tilted state of the semiconductor laser device 200 are jointly used, the liquid surface 137 of the liquid 128 may partly or wholly cover the light emitter 170 or the light receiver 171 by oscillations applied from the oscillation mechanism 154. In view of this, the liquid 128 is supplied to such a position that does not cover the light emitter 170 and the light receiver 171 even if oscillations are applied from the oscillation mechanism 154.

The following is a description on an experiment result obtained by operating a red laser element as a light source in a display device, as an example of the semiconductor laser device 200 as the modification of the sixth embodiment.

FIGS. 22A and 22B are charts for comparing characteristics of the semiconductor laser device 200 as the modification of the sixth embodiment, and characteristics of a conventional semiconductor laser device, in the case where the semiconductor laser element 125 fabricated from an identical wafer is mounted in the semiconductor laser device 200 as the modification of the sixth embodiment, and the conventional semiconductor laser device, respectively. FIG. 22A is a chart showing the characteristics of the semiconductor laser device 200 as the modification of the sixth embodiment. FIG. 22B is a chart showing the characteristics of the conventional semiconductor laser device. The characteristics of the conventional semiconductor laser device are characteristics of the semiconductor laser device 200 in the case where the semiconductor laser device 200 shown in FIG. 18 is operated in a state that the liquid 128 is not supplied to the container 121.

The semiconductor laser element 125 used in the experiment is an AlGaInP-based semiconductor laser element for emitting red laser beams of 640 nm wavelength. The semiconductor laser element 125 has such dimensions that the length, the width, and the thickness of the laser resonator are 2 mm, 300 μm, and 150 μm, respectively. The length, the width, and the thickness of the active region are 2 mm, 100 μm, and 0.08 μm, respectively. Both of the laser electrode and the rear electrode have a surface made of a gold material. In the experiment, four samples of the semiconductor laser element were prepared to measure the characteristics. The active region is designed to emit a laser beam of 0.5 watt.

As is obvious from the data shown in FIGS. 22A and 22B, as compared with the conventional semiconductor laser device, the semiconductor laser device 200 as the modification of the sixth embodiment is advantageous in efficiently cooling the active region 124 by the liquid 128 whose liquid temperature TL is set to 25° C. Accordingly, as compared with the conventional semiconductor laser device, the semiconductor laser device 200 as the modification of the sixth embodiment has improved characteristics that the operation current Iop is increased by about 5% in average, and the slope efficiency is increased by about 3% in average. The ambient temperature Ta of the conventional semiconductor laser device is 25° C., which is the same temperature condition as the semiconductor laser device 200 in the modification of the sixth embodiment. However, since the semiconductor laser element in the conventional semiconductor laser device is not cooled by the liquid 128, the temperature of the semiconductor laser element in the conventional semiconductor laser device is higher than the temperature of the semiconductor laser element in the semiconductor laser device as the modification of the sixth embodiment by about 10° C.

The above experiment result shows that the arrangement of the semiconductor laser device 200 shown in FIG. 18 is advantageous in operating the semiconductor laser device at a low-consumption current. Also, as compared with the conventional semiconductor laser device, the semiconductor laser device 200 as the modification of the sixth embodiment enables to reduce the operation voltage Vop by about 4%. Thus, the electric power consumption can be reduced more than reduction proportional to the consumption current. Thus, it is obvious that the semiconductor laser device 200 as the modification of the sixth embodiment can be operated at a low-consumption electric power, in addition to a low-consumption current, as compared with the conventional semiconductor laser device.

In the sixth embodiment, the semiconductor laser device is described by taking an example of an AlGaInP-based red semiconductor laser device for emitting laser beams of 640 nm wavelength. Alternatively, it is possible to use a semiconductor laser device with an output wavelength different from that of the aforementioned semiconductor laser device, or using a material different from the material of the aforementioned semiconductor laser device. For instance, as far as the semiconductor laser device is used in an image display device such as a panel display device, various semiconductor laser devices including a GaN-based blue semiconductor laser device, and a multi-wavelength semiconductor laser device such as a dual wavelength semiconductor laser device may be used. It is needless to say that an AlGaAs-based semiconductor laser device popularly used for an optical disc, or an InGaAsP-based or InGaAs-based semiconductor laser device for use in optical communication is usable.

The container 121 used in the sixth embodiment is made of a metallic material having improved heat releasability except for the transparent member 134. Alternatively, primary part of the container 121 may be integrally molded, using other material such as a resin material. Further alternatively, the wiring substrate 161 and the container 121 may be integrally formed.

The liquid 128 for cooling the semiconductor laser element 125 is e.g. Fluorinert™, which is a liquid having insulating and inert properties. Alternatively, as far as the liquid has a similar cooling effect, and has insulating and inert properties, any liquid may be used.

Seventh Embodiment

Figure 23:
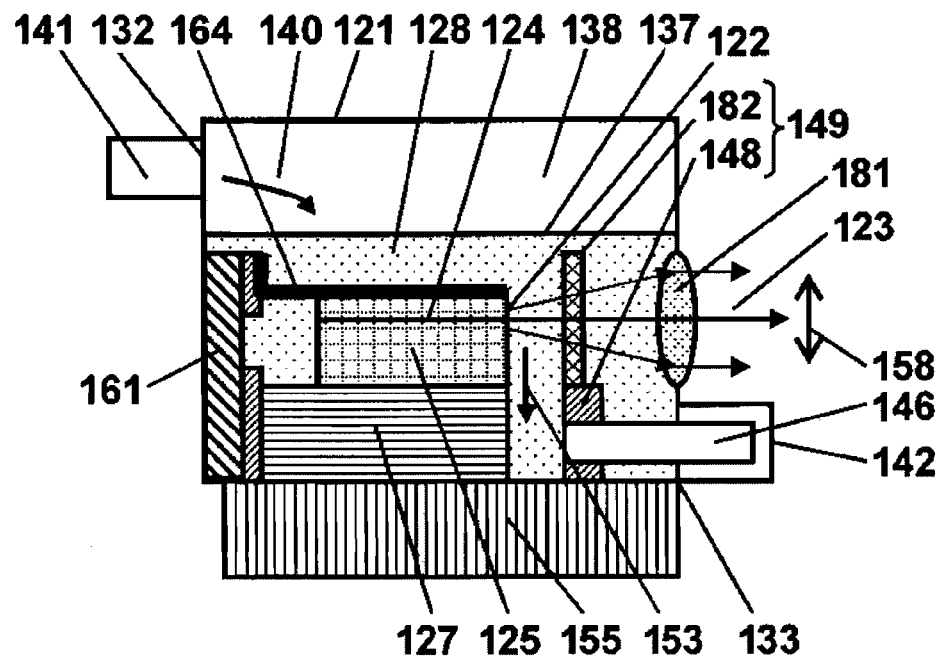
FIG. 23 is a diagram schematically showing primary parts of a semiconductor laser device as a seventh embodiment of the invention.

FIG. 23 is a diagram schematically showing primary parts of a semiconductor laser device 210 as the seventh embodiment of the invention. Unlike the internal arrangement of the container 121 of the semiconductor laser device 200 as the sixth embodiment, in the seventh embodiment, a flat plate-like optical component 182 is used as a flow regulator 149, and a transparent member 181 e.g. a convex lens is used as a member for extracting laser beams 123 from a container 121.

The above arrangement is advantageous in reducing the interval between the flow regulator 149 and the front end surface 122 of the semiconductor laser element 125 to more rapidly flow the liquid 128 in the direction of the arrow 153 to thereby efficiently cool the active region 124 of the semiconductor laser element 125. The transparent member 181 is disposed in proximity to the front end surface 122 of the semiconductor laser element 125 to efficiently collect the laser beams 123 to be emitted from the front end surface 122 of the semiconductor laser element 125. This enables to reduce the dimensions of the container 121.

The effect resulting from a difference in arrangement between the sixth embodiment and the seventh embodiment is described as above. The effects of the seventh embodiment to be obtained from the constituent elements substantially identical or equivalent to those of the sixth embodiment are substantially the same as the effects of the sixth embodiment.

Specifically, the semiconductor laser device 210 as the seventh embodiment is advantageous in efficiently cooling the front end surface 122 and the active region 124 of the semiconductor laser element 125 by the liquid 128 to suppress a temperature rise of the semiconductor laser element 125. Accordingly, the semiconductor laser device 210 can be operated at a low-consumption current and a low-consumption electric power, and with a watt-class high-output performance. An image display device incorporated with the semiconductor laser device 210 can be advantageously operated at a low-consumption electric power, because the laser light sources are operated at a low-consumption electric power. Also, the image display device is safety-oriented by suspending an operation of the image display device if the image display device is tilted by e.g. tipping over. Further, the image display device enables to display high-quality images with less speckle noises.

Eighth Embodiment

FIGS. 24 through 27 are diagrams schematically showing various examples of a semiconductor laser device as the eighth embodiment of the invention. The semiconductor laser device as the eighth embodiment is so designed as to simultaneously emit multiple laser beams.

Figure 24:
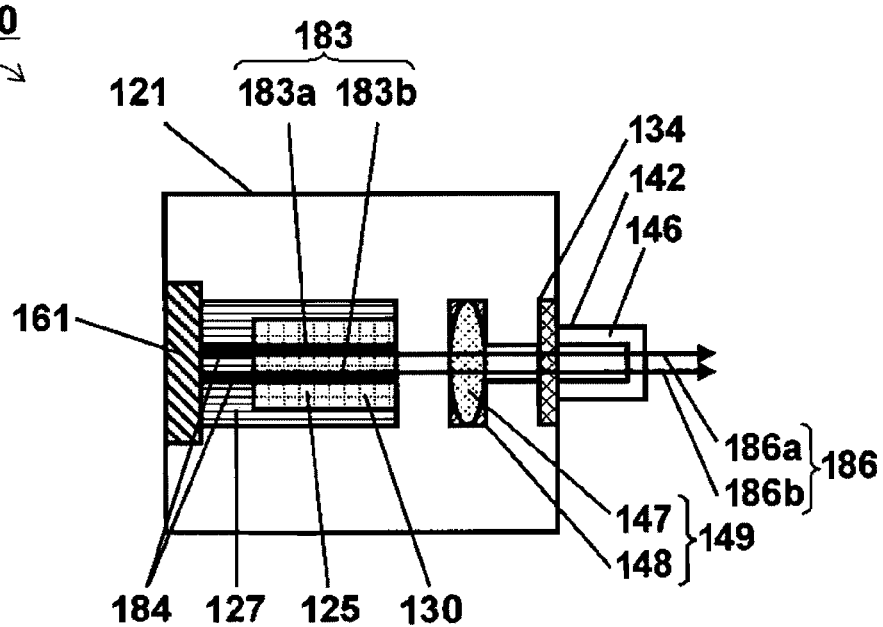
FIG. 24 is a diagram schematically showing an example of a semiconductor laser device as an eighth embodiment of the invention.

As shown in FIG. 24, in a semiconductor laser device 220 as an example of the eighth embodiment, stripe active regions 183a and 183b are provided as an active region 183 of a semiconductor laser element 125 in a container 121. Corresponding conductive members 184 are connected to the active regions 183a and 183b of the semiconductor laser element 125, respectively. The conductive members 184 are electrically connected to a wiring substrate 161 individually. For instance, the semiconductor laser element 125 corresponds to an array structured semiconductor laser element having two active regions for emitting high-output red laser beams. In this arrangement, high-output laser beams 186 (186a, 186b) can be outputted at a low-consumption current and a low-consumption electric power. Also, since a first surface 130 of the semiconductor laser element 125 close to the active regions 183a and 183b of the semiconductor laser element 125 is oriented upward, the active regions 183a and 183b can be simultaneously cooled. Furthermore, since electrodes are formed in correspondence to the active regions 183a and 183b, respectively, the active regions 183a and 183b can be driven independently of each other.

Figure 25:
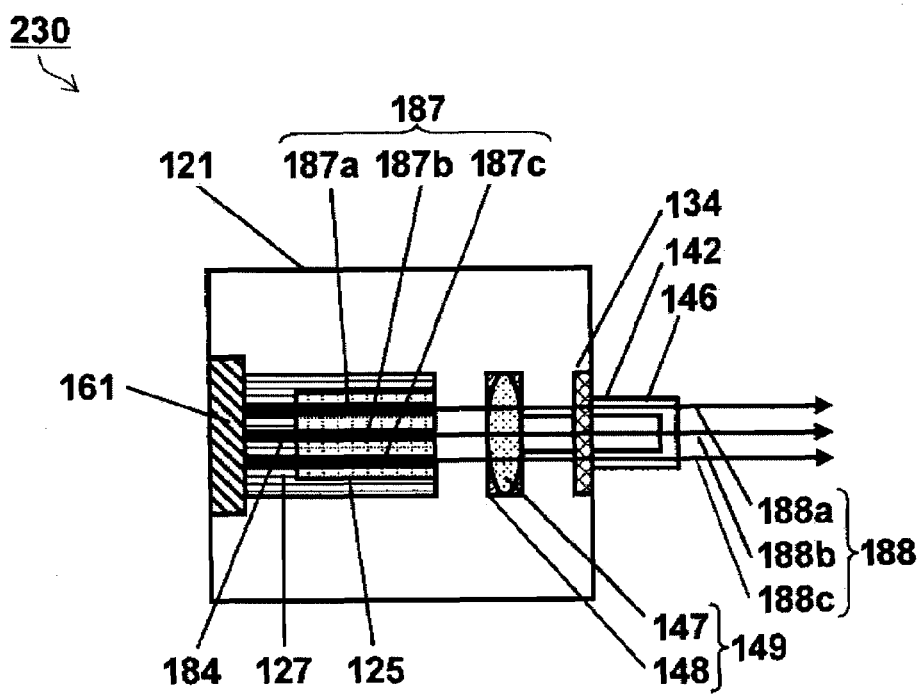
FIG. 25 is a diagram schematically showing another example of the semiconductor laser device as the eighth embodiment of the invention.

In a semiconductor laser device 230 shown in FIG. 25, as another example of the eighth embodiment, stripe active regions 187a and 187b for emitting red laser beams as shown in FIG. 24, and an active region 187c for emitting infrared beams constitute an active region 187 of a semiconductor laser element 125 in a container 121. For instance, the semiconductor laser element 125 shown in FIG. 25 corresponds to a dual-wavelength semiconductor laser element provided with two active regions for emitting high-output red laser beams, and one active region for emitting infrared laser beams. In this arrangement, dual-wavelength high-output laser beams 188 (188a, 188b, 188c) can be outputted at a low-consumption current and a low-consumption electric power.

Figure 26:
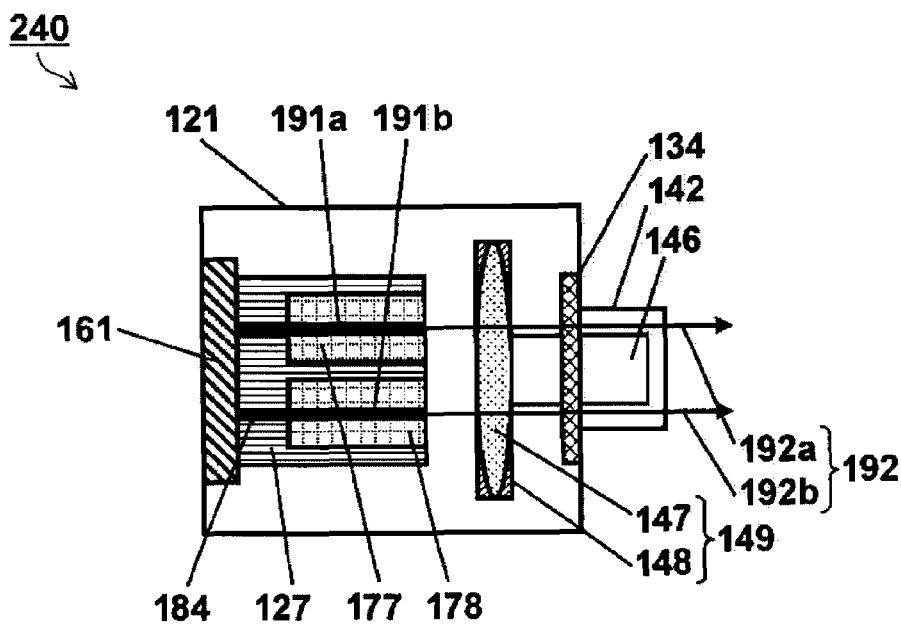
FIG. 26 is a diagram schematically showing yet another example of the semiconductor laser device as the eighth embodiment of the invention.

In a semiconductor laser device 240 shown in FIG. 26, as yet another example of the eighth embodiment, two individual semiconductor laser elements 177 and 178 are provided. The semiconductor laser element 177 includes an active region 191a for emitting at least high-output red laser beams. The semiconductor laser element 178 includes an active region 191b for emitting at least high-output blue laser beams. In this arrangement, dual-wavelength high-output laser beams 192 (192a, 192b) can be outputted at a low low-consumption current and a low-consumption electric power.

In the above arrangement, there is no need of applying an AR (Anti-Reflection) coat to an inner surface i.e. a semiconductor-laser-element side of a light emission glass surface of the semiconductor laser device 240, i.e. a transparent member 134. This is because there is less reflection on the glass surface since the interior of the container is filled with a liquid. It is not easy to apply the AR coat to a semiconductor laser element for outputting laser beams of two or more different wavelengths. In the eighth embodiment, since there is no need of applying the AR coat, it is possible to produce the semiconductor laser device at a low cost.

Figure 27:
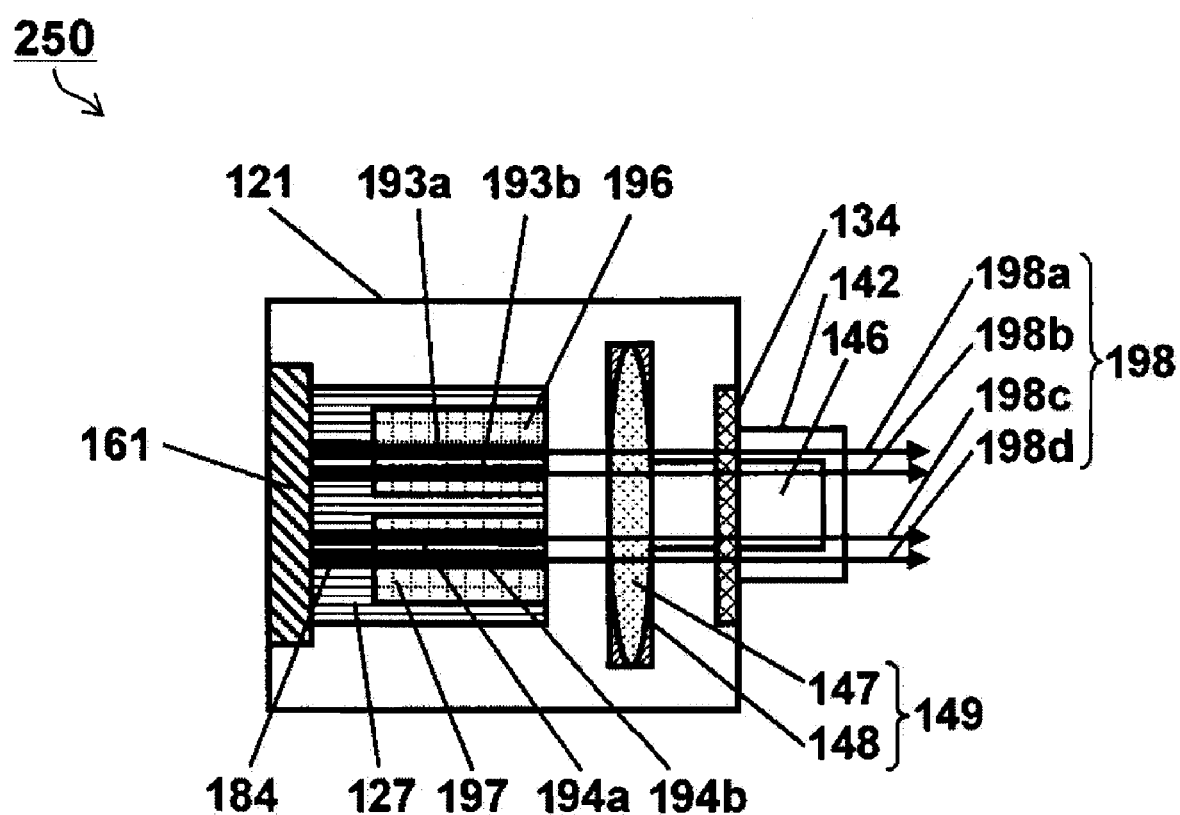
FIG. 27 is a diagram schematically showing still another example of the semiconductor laser device as the eighth embodiment of the invention.

In a semiconductor laser device 250 shown in FIG. 27, as still another example of the eighth embodiment, two semiconductor laser elements 196 and 197 are provided in a container 121. The semiconductor laser element 196 is a dual-wavelength semiconductor laser element provided with an active region 193a for emitting high-output red laser beams, and an active region 193b for emitting infrared laser beams. The semiconductor laser element 197 is a semiconductor laser array element provided with two active regions 194a and 194b for emitting high-output blue laser beams. In this arrangement, laser beams 198 (198a, 198b, 198c, 198d) of different wavelengths can be simultaneously outputted.

Alternatively, a semiconductor laser device may be constructed by mounting a currently-developed semiconductor laser element for emitting green laser beams, in place of the high-output semiconductor laser element for emitting infrared laser beams. Further alternatively, a semiconductor laser element for outputting red, green, and blue laser beams, or a semiconductor laser array element for outputting red, green, and blue laser beams may be mounted.

In the semiconductor laser device capable of emitting multi-wavelength or multiple laser beams, as described in the eighth embodiment, the front end surface and the active region of the semiconductor laser element are efficiently cooled by the liquid to suppress a temperature rise of the semiconductor laser element. This enables to operate the semiconductor laser device at a low-consumption current and a low-consumption electric power, and with a watt-class high-output performance. Also, an image display device incorporated with the semiconductor laser device can be advantageously operated at a low-consumption electric power, because laser light sources are operated at a low-consumption electric power. Also, the image display device is safety-oriented by suspending an operation of the image display device if the image display device is tilted by e.g. tipping over. Further, the image display device enables to display high-quality images with less speckle noises.

Ninth Embodiment

Figure 28:
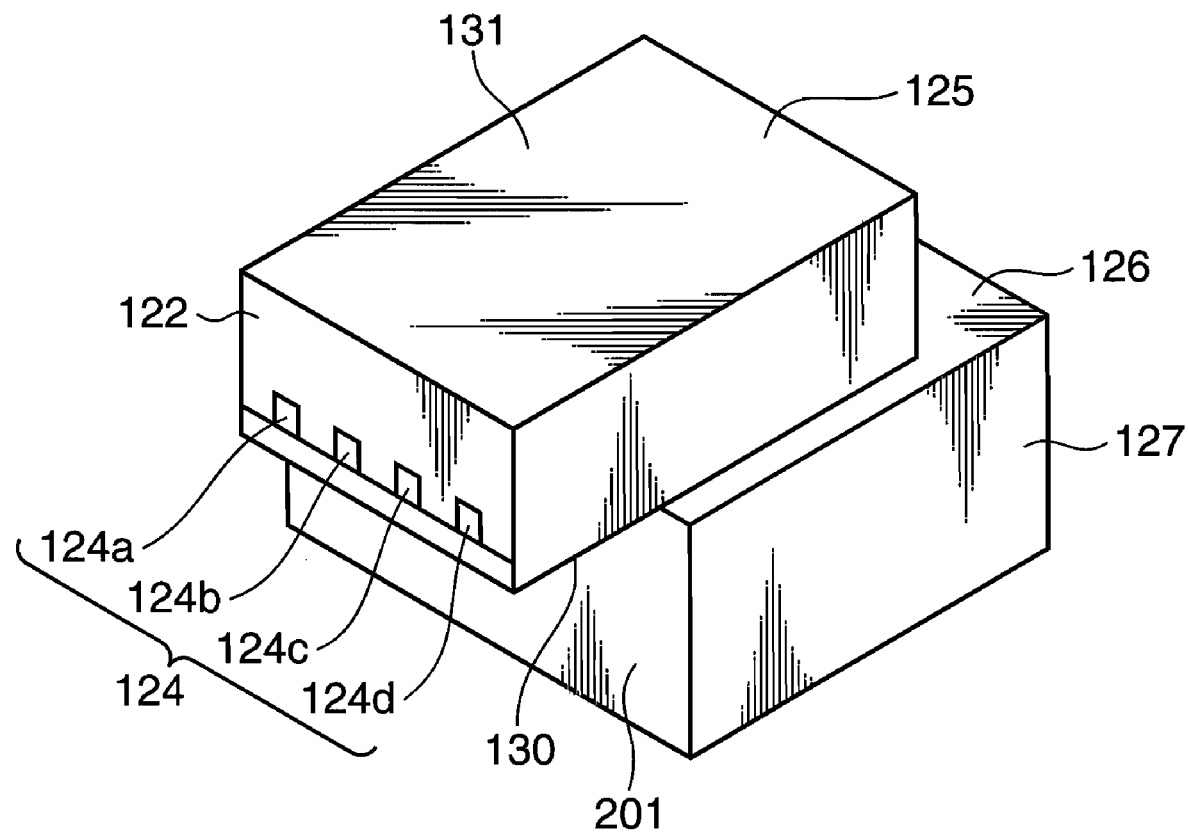
FIG. 28 is a diagram schematically showing an arrangement of a semiconductor laser element and a base block in a semiconductor laser device as a ninth embodiment of the invention.

FIG. 28 is a diagram schematically showing an arrangement of a semiconductor laser element and a base block of a semiconductor laser device as the ninth embodiment of the invention. The arrangement of the semiconductor laser device as the ninth embodiment is substantially the same as the arrangement of the semiconductor laser device 200 shown in FIG. 18 except for the arrangement of the semiconductor laser element and the base block. Accordingly, merely the arrangement of the semiconductor laser device as the ninth embodiment which is different from the arrangement of the semiconductor laser device 200 shown in FIG. 18 is described herein.

The semiconductor laser device 200 shown in FIG. 18 is constructed in such a manner that the semiconductor laser element 125 is mounted on the upper surface 126 of the base block 127, with the first surface 130 thereof close to the active region 124 of the semiconductor laser element 125 being oriented upward, and the second surface 131 thereof opposing to the first surface 130 being oriented downward.

On the contrary, the semiconductor laser device shown in FIG. 28 as the ninth embodiment is constructed in such a manner that a semiconductor laser element 125 is mounted on an upper surface 126 of a base block 127, with a first surface 130 thereof close to an active region 124 of the semiconductor laser element 125 being oriented downward, and a second surface 131 thereof opposing to the first surface 130 being oriented upward.

In the above arrangement, in the case where a front end surface 122 of the semiconductor laser element 125 is set flush with a front end surface 201 of the base block 127, the entirety of the first surface 130 close to the active region 124 is contacted with the upper surface 126 of the base block 127. As a result, as compared with the arrangement that the first surface 130 close to the active region 124 is oriented upward, it is difficult to efficiently cool the active region 124.

In view of the above, in the semiconductor laser device shown in FIG. 28 as the ninth embodiment, the semiconductor laser element 125 is mounted in such a manner that the front end surface 122 protrudes from the front end surface 201 of the base block 127. Thereby, even if the semiconductor laser element 125 is mounted, with the first surface 130 being oriented downward and the second surface 131 being oriented upward, a part of the first surface 130 is contacted with a liquid 128 to release the heat generated in the active region 124. This enables to efficiently cool the active region 124.

Stripe active regions 124a, 124b, 124c, and 124d are provided as the active region 124 of the semiconductor laser element 125 in the ninth embodiment. The active regions 124a and 124d located at both outer ends of the stripe active regions 124a, 124b, 124c, and 124d emit laser beams of higher output than laser beams to be emitted from the active regions 124b and 124c located in the middle of the stripe active regions 124a, 124b, 124c, and 124d.

Specifically, the outer-located active regions 124a and 124d out of the stripe active regions 124a, 124b, 124c, and 124d are more efficiently cooled than the middle-located active regions 124b and 124c. Accordingly, the above arrangement enables to set the output of the outer-located active regions 124a and 124d higher than the output of the middle-located active regions 124b and 124c.

The arrangement of the semiconductor laser device as the ninth embodiment can be applied to the arrangements of the semiconductor laser devices as the first through the eighth embodiments, as well as the semiconductor laser device as the modification of the sixth embodiment shown in FIG. 18.

Alternatively, the wiring arrangements of the semiconductor laser element and the base block in the first through third embodiments may be applied as the wiring arrangements of the semiconductor laser element and the base block in the semiconductor laser devices as the sixth through the ninth embodiments.

Tenth Embodiment

Figure 29:
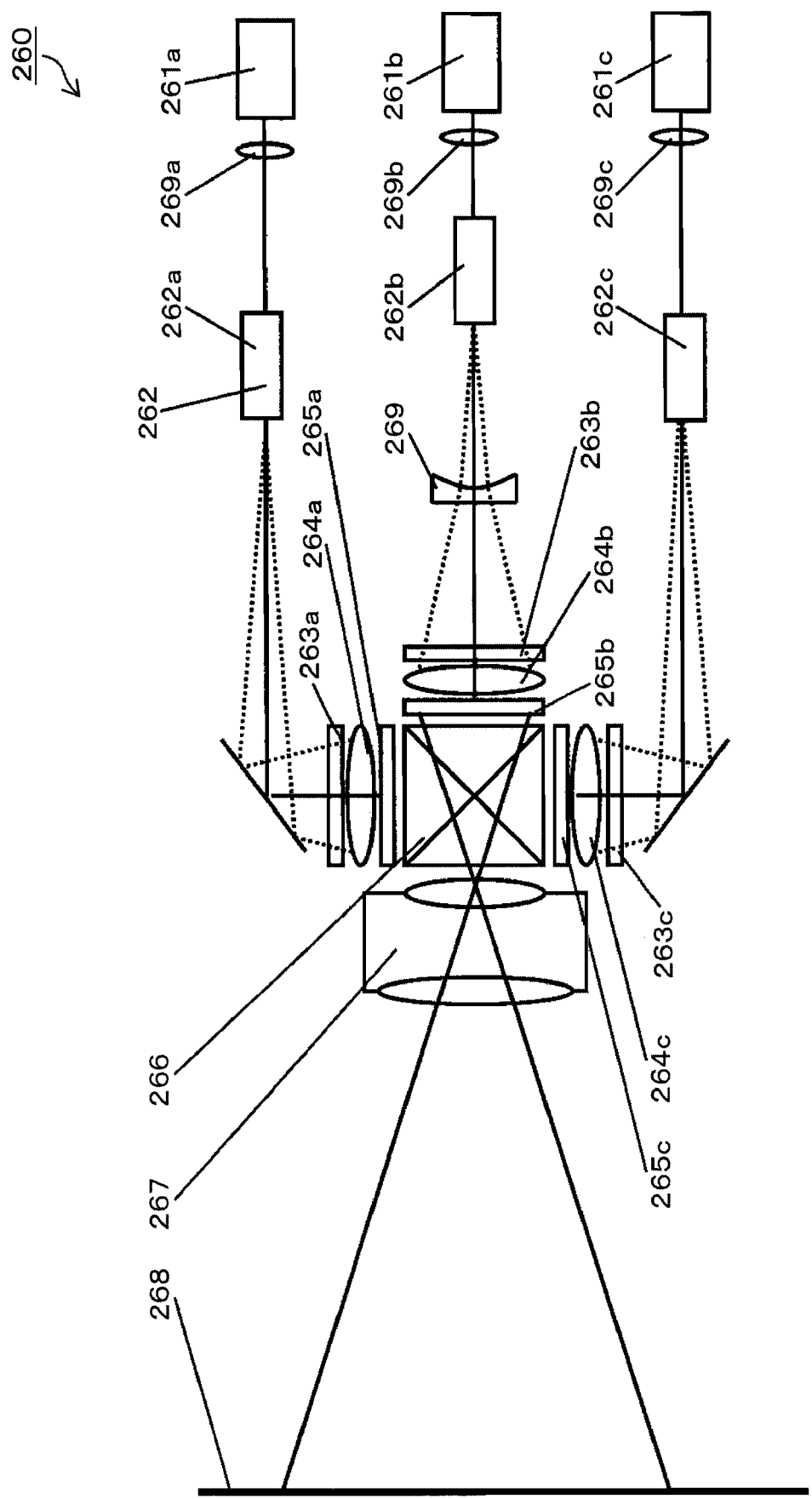
FIG. 29 is a diagram schematically showing an example of an arrangement of an image display device as a tenth embodiment of the invention.

FIG. 29 is a diagram schematically showing an example of an arrangement of an image display device 260 as the tenth embodiment of the invention, to which the semiconductor laser device of the sixth, the seventh, the eighth, or the ninth embodiment is applied. Laser light sources 261a, 261b, and 261c for emitting laser beams of three different colors of red (R), green (G), and blue (B) are used as a light source. An AlGaInP/GaAs-based semiconductor laser device for emitting laser beams of 640 nm wavelength is used as the red laser light source 261a. A GaN-based semiconductor laser device for emitting laser beams of 450 nm wavelength is used as the blue laser light source 261c. A wavelength conversion device, equipped with a wavelength conversion element for converting the wavelength of an infrared laser beam into one-half of the original wavelength, for emitting laser beams of 530 nm wavelength, is used as the green laser light source 261b. In this embodiment, there is used a projecting section including a projection optical system for emitting laser beams.

As shown in FIG. 29, the image display device 260 as the tenth embodiment includes the laser light sources 261a, 261b, and 261c, and lenses 262a, 262b, and 262c for expanding the laser beams emitted from the laser light sources 261a, 261b, and 261c. The laser light sources 261a, 261b, and 261c emit at least red, green, and blue laser beams, respectively. At least one of the laser light source 261a for emitting red laser beams, and the laser light source 261c for emitting blue laser beams, out of the laser light sources 261a, 261b, and 261c, includes the semiconductor laser device of the sixth, the seventh, the eighth, or the ninth embodiment. In this embodiment, the semiconductor laser device is used as the laser light source 261a for emitting red laser beams of 640 nm wavelength, and the laser light source 261c for emitting blue laser beams of 450 nm wavelength.

In the following, an arrangement of an optical system for forming an image with use of the laser light sources of the image display device 260 as the tenth embodiment is described. After the laser beams of R, G, and B emitted from the laser light sources 261a, 261b, and 261c of the image display device 260 are condensed on condenser lenses 269a, 269b, and 269c, the condensed laser beams are expanded on diffusers 263a, 263b, and 263c through the lenses 262a, 262b, and 262c, respectively. The expanded laser beams are formed at slightly different positions, because the semiconductor laser element is oscillated to change the laser beam forming position.

The laser beams expanded on the diffusers 263a, 263b, and 263c are incident onto space modulating elements 265a, 265b, and 265c after convergence on field lenses 264a, 264b, and 264c, respectively. Image data is divided into R data, G data, and B data, and the individual data are inputted to the space modulating elements 265a, 265b, and 265c, respectively. The laser beams modulated by the space modulating elements 265a, 265b, and 265c are synthesized into a color image by a dichroic prism 266. The synthesized color image is projected onto a screen 268 by a projection lens 267. There is provided a concave lens 269 on an optical path from the green laser light source 261b to the space modulating element 265b for making the spot size of a green laser beam on the space modulating element 265b substantially identical to the spot size of a red laser beam or a blue laser beam.

As described above, the image display device 260 as the tenth embodiment is advantageous, as compared with an arrangement of using an ordinary semiconductor laser device, in that the laser light sources are operated at a low-consumption current and a low-consumption electric power, and with a long operation life, by using the semiconductor laser device of the sixth, the seventh, the eighth, or the ninth embodiment. Thus, the image display device 260 can be operated at a low-consumption current and a low-consumption electric power, and with a long operation life. Also, the image display device 260 as the tenth embodiment is safety-oriented by suspending an operation of the image display device 260 if the image display device 260 is tilted by e.g. tipping over. Further, the image display device 260 enables to display high-quality images with less speckle noises by oscillating the semiconductor laser element 125.

Eleventh Embodiment

Figure 30:
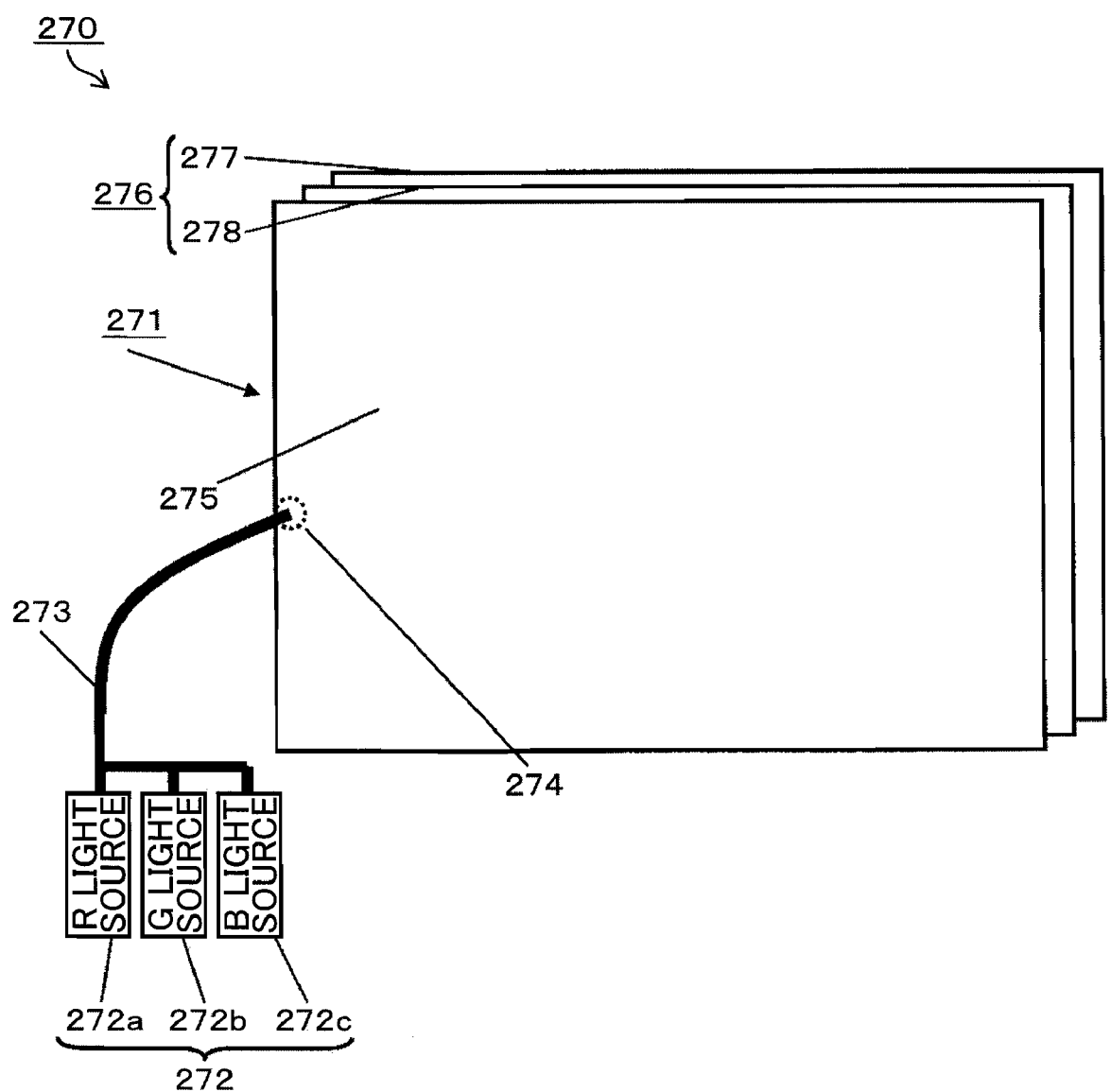
FIG. 30 is a diagram schematically showing an example of an arrangement of an image display device as an eleventh embodiment of the invention.

FIG. 30 is a diagram schematically showing an example of an arrangement of an image display device as the eleventh embodiment of the invention, to which a backlight illuminator incorporated with the semiconductor laser device of the sixth, the seventh, the eighth, or the ninth embodiment is applied. FIG. 30 is a diagram schematically showing an arrangement of a liquid crystal display device 270 as an example of the image display device.

The liquid crystal display device 270 shown in FIG. 30 includes a liquid crystal display panel 276, and a backlight illuminator 271 for illuminating the liquid crystal display panel 276 from the backside. The backlight illuminator 271 includes multiple laser light sources 272. The laser light sources 272 include light sources for emitting laser beams of at least red, green, and blue, respectively. Specifically, the laser light sources 272 are constituted of a red laser light source (indicated by the R light source in FIG. 30) 272a for emitting red laser beams, a green laser light source (indicated by G light source in FIG. 30) 272b for emitting green laser beams, and a blue laser light source (indicated by B light source in FIG. 30) 272c for emitting blue laser beams. At least one of the red laser light source 272a and the blue laser light source 272c out of the laser light sources 272 includes the semiconductor laser device of the sixth, the seventh, the eighth, or the ninth embodiment.

In this embodiment, an AlGaInP/GaAs-based semiconductor laser device for emitting laser beams of 640 nm wavelength is used as the red laser light source 272a. A GaN-based semiconductor laser device for emitting laser beams of 450 nm wavelength is used as the blue laser light source 272c. A wavelength conversion device, equipped with a wavelength conversion element for converting the wavelength of an infrared laser beam into one-half of the original wavelength, for emitting laser beams of 530 nm wavelength is used as the green laser light source 272b.

In the following, the arrangement of the liquid crystal display device 270 as the eleventh embodiment is further described. The liquid crystal display panel 276 includes a polarizing plate 277 for displaying an image by utilizing the red, green, and blue laser beams emitted from the backlight illuminator 271, and a liquid crystal plate 278. The backlight illuminator 271 in the eleventh embodiment shown in FIG. 30 includes the laser light sources 272, an optical fiber 273 for collectively guiding the red, green, and blue laser beams from the laser light sources 272 to a light guiding plate 275 via a light guider 274, and the light guiding plate 275 for emitting red, green, and blue laser beams from a principal plane (not shown) where the red, green, and blue laser beams introduced from the light guider 274 and uniformly collected. The laser beams to be guided are formed at slightly different positions, because the semiconductor laser element is oscillated to change the laser beam forming position. Accordingly, a condition of the laser beams guided in the multi-mode optical fiber is changed. Thereby, speckle noises are removed.

As described above, the liquid crystal display device 270 as the eleventh embodiment is advantageous, as compared with an arrangement of using an ordinary semiconductor laser device, in that the laser light sources are operated at a low-consumption current and a low-consumption electric power, and with a long operation life, by using the semiconductor laser device of the sixth, the seventh, the eighth, or the ninth embodiment in the laser light sources of the backlight illuminator 271. Thus, the liquid display device 270 can be operated at a low-consumption current and a low-consumption electric power, and with a long operation life.

Also, the liquid crystal display device 270 as the eleventh embodiment is safety-oriented by suspending an operation of the liquid crystal display device 270 if the liquid crystal display device 270 is tilted by e.g. tipping over. Further, the liquid crystal display device 270 enables to display high-quality images with less speckle noises. Further, since the semiconductor laser element for emitting red, blue, and green laser beams can be cooled in a single package, the semiconductor laser device can be miniaturized without unduly increasing the construction for releasing the heat.

The aforementioned embodiments and/or modifications primarily include the inventions having the following arrangements.

A semiconductor laser device according to an aspect of the invention comprises a semiconductor laser element including stripe active regions for emitting laser beams; and a base block on which wirings are formed, the wirings being electrically connected to stripe laser electrodes of the semiconductor laser element, respectively, the stripe laser electrodes corresponding to the stripe active regions being formed in proximity to a first surface of the semiconductor laser element, close to the active regions, wherein an electric current is supplied to the active regions from connecting portions between each of the laser electrodes and the wirings.

In the above arrangement, a heat generated in the stripe active regions is efficiently released from the wirings connected to the active regions, and the base block via each of the laser electrodes. Also, the electric current is uniformly supplied to the active regions from the connecting portions between the laser electrodes and the wirings. Thus, since the supplied electric current is efficiently converted into high-output laser beams, the semiconductor laser device can be operated at a low-consumption current and a low-consumption electric power.

In the semiconductor laser device, preferably, the wirings may be respectively connected to electrode parts formed in a periphery of a laser mounting surface on the base block where the semiconductor laser element is mounted.

In the above arrangement, the wirings are respectively connected to the electrode parts formed in the periphery of the laser mounting surface on the base block where the semiconductor laser element is mounted. Accordingly, electrical connection between a package electrode or a circuit board electrode, and the laser electrodes can be efficiently performed.

In the semiconductor laser device, preferably, the wirings connected to each of the laser electrodes may be connected to a corresponding single electrode part formed in a periphery of a laser mounting surface on the base block where the semiconductor laser element is mounted.

In the above arrangement, even if an electric current is supplied to a corresponding one of the electrode parts by a wiring from an external power source, the electric current can be uniformly supplied to the corresponding active region from the multiple sites of the corresponding one of the laser electrodes by the wirings.

In the semiconductor laser device, preferably, a wiring may be formed on at least one of a rear surface of the base block opposing to the laser mounting surface, and an inner portion of the base block.

The above arrangement enables to connect a wiring for supplying an electric current at an intended portion of the active regions. Specifically, by stereoscopically forming wirings inside the base block, an electric current can be supplied to an intended portion of the active regions from the electrode parts formed in the periphery of the base block. This enables to more uniformly supply the electric current to each of the stripe active regions.

In the semiconductor laser device, preferably, the semiconductor laser element may include: a front end surface perpendicular to the stripe active regions and adapted to emit the laser beams; and a rear end surface opposing to the front end surface, the front end surface and the rear end surface constituting a laser resonator, the base block may have a larger size than the laser resonator at a rear position of the rear end surface of the semiconductor laser element, and the electrode parts may be formed on the laser mounting surface at a rear position of the base block.

The above arrangement enables to extend the wirings from the stripe laser electrodes rearwardly of the base block. Thereby, the laser electrodes of the semiconductor laser element can be properly connected to the electrode parts on the laser mounting surface.

Preferably, the semiconductor laser device may further comprise: a package for disposing the base block with the semiconductor laser element, the package including a connecting electrode part for connecting the semiconductor laser device to an external device, wherein a rear electrode is formed on a second surface of the semiconductor laser element, the second surface being formed in parallel to the first surface and opposing thereto, respective one ends of conductive wires are connected to the rear electrode along the corresponding stripe active region, and the respective other ends of the conductive wires are connected to the connecting electrode part.

In the above arrangement, an electric current to be supplied to the active regions is supplied from the connecting portions of the laser electrode on the first surface of the semiconductor laser element, and discharged from the connecting portions on the rear electrode on the second surface of the semiconductor laser element. This enables to more uniformly supply the electric current to the active regions. Specifically, the conductive wires are connected to the rear electrode from which the electric current is discharged along the stripe active regions. This enables to discharge the uniformly-supplied electric current from the entirety of the active regions.

In the semiconductor laser device, preferably, the respective one ends of the conductive wires may be connected to the rear electrode at multiple sites thereof with a matrix pattern.

In the above arrangement, the respective one ends of the conductive wires are connected to the rear electrode from which an electric current is discharged at the multiple sites with the matrix pattern. This enables to discharge the uniformly-supplied electric current from the entirety of the active regions.

In the semiconductor laser device, preferably, the respective one ends of the conductive wires may be connected to the rear electrode at a position opposing to the corresponding laser electrode with respect to the corresponding active region.

In the above arrangement, the conductive wires are connected to the rear electrode from which an electric current is discharged at the position opposing to the laser electrodes with respect to the active regions. This enables to discharge the uniformly-supplied electric current from the entirety of the active regions.

Preferably, the semiconductor laser device may further comprise: a circuit board including a first substrate electrode part to be electrically connected to the corresponding electrode part, wherein a bump is formed on the first substrate electrode part, and the respective electrode parts and the first substrate electrode part are electrically connected to each other via the bump.

In the above arrangement, the electrode parts can be connected to the other circuit board or a like member via the bump formed on the first substrate electrode part of the circuit board, without using a conductive wire. This enables to operate the semiconductor laser device at a high-output laser power by supplying a large electric current to the semiconductor laser element, while securing miniaturization and high reliability of the semiconductor laser device.

In the semiconductor laser device, preferably, a rear electrode may be formed on a second surface of the semiconductor laser element, the second surface being formed in parallel to the first surface and opposing thereto, the circuit board may further include a second substrate electrode part to be electrically connected to the rear electrode, a bump may be formed on the second substrate electrode part, and the rear electrode and the second substrate electrode part may be electrically connected to each other via the bump.

In the above arrangement, the rear electrode can be connected to the other circuit board or a like member via the bump formed on the second substrate electrode part of the circuit board, without using a conductive wire. This enables to operate the semiconductor laser device at a high-output laser power by supplying a large electric current to the semiconductor laser element, while securing miniaturization and high reliability of the semiconductor laser device.

Preferably, the semiconductor laser device may further comprise: a container adapted to contain an insulating and transparent liquid having a property of transmitting the laser beams, wherein the semiconductor laser element is mounted on an upper surface of the base block, with the first surface of the semiconductor laser element close to the stripe active regions being oriented upward, and a second surface of the semiconductor laser element opposing to the first surface being oriented downward, the base block is disposed on a bottom portion of the container in such a manner that the first surface of the semiconductor laser element is immersed in the liquid, the container includes an area for emitting at least the laser beams, the area being formed of a transparent member having a property of transmitting the laser beams, and the liquid is allowed to move from a position on the first surface of the semiconductor laser element, and a position in proximity to a front end surface of the semiconductor laser element to cool the stripe active regions.

In the above arrangement, after the heat is transferred to the liquid by the first surface of the semiconductor laser element close to the active regions, and the front end surface of the semiconductor laser element, the liquid is allowed to move in the container provided with the semiconductor laser element. Then, as the liquid is subjected to thermal circulation, the liquid sequentially and efficiently cools the first surface of the semiconductor laser element close to the active regions, and the front end surface of the semiconductor laser element, thereby suppressing a temperature rise of the semiconductor laser element. This enables to operate the semiconductor laser device at a low-consumption current and a low-consumption electric power, and with a watt-class high-output performance.

In the semiconductor laser device, preferably, a space may be defined by a liquid surface of the liquid contained in the container, and a top surface of the container, the container may include an inlet port for drawing the liquid into the container, and an outlet port for discharging the liquid from the container, the semiconductor laser device may further include a pump for drawing the liquid into the container through the inlet port, and discharging the liquid from the container through the outlet port to generate a flow of the liquid in the container, and the liquid may be allowed to flow on the first surface along an optical axis direction of the semiconductor laser element, and along the front end surface of the semiconductor laser element to cool the stripe active regions.

In the above arrangement, after the heat is transferred to the liquid by the first surface of the semiconductor laser element close to the active regions, and the front end surface of the semiconductor laser element, the liquid is allowed to move in the container provided with the semiconductor laser element. Then, as the liquid is circulated by the pump, the liquid sequentially and efficiently cools the first surface of the semiconductor laser element close to the active regions, and the front end surface of the semiconductor laser element, thereby further advantageously suppressing a temperature rise of the semiconductor laser element. This enables to operate the semiconductor laser device at a low-consumption current and a low-consumption electric power, and with a watt-class high-output performance.

Preferably, the semiconductor laser device may further comprise an oscillation mechanism for oscillating the container.

In the above arrangement, by oscillating the container, the liquid in the container can be oscillated. Oscillation of the liquid enables to rapidly release the heat generated in the semiconductor laser element therefrom. This enables to operate the semiconductor laser device at a low-consumption current and a low-consumption electric power, and with a watt-class high-output performance. Also, by oscillating the container, the semiconductor laser element in the container can be oscillated. Oscillation of the semiconductor laser element allows for a change in emission position of the laser beams to be outputted from the semiconductor laser device, with time. This is advantageous in reducing speckle noises, which may be generated in the case where the semiconductor laser device is used as a light source in an image display device, for instance.

Preferably, the semiconductor laser device may further comprise: a light emitter disposed on an inner side wall of the container; a light receiver disposed on the other inner side wall of the container at a position opposing to the light emitter; and a controller for detecting a change in amount of light received by the light receiver to control an operation of the semiconductor laser element in accordance with the detected change in received light amount, wherein the light emitter and the light receiver are disposed as opposed to each other with respect to a space defined above the liquid surface in the container, and the controller suspends the operation of the semiconductor laser element in the case where the change in received light amount is detected by covering at least a part of the light emitter or the light receiver with the liquid.

In the above arrangement, if the semiconductor laser device is tilted, the operation of the semiconductor laser element is suspended. This enables to provide safe use of the semiconductor laser device, even if the semiconductor laser device is individually incorporated in an electronic device or a like device.

Preferably, the semiconductor laser device may further comprise: an optical component disposed as opposed to the front end surface of the semiconductor laser element perpendicular to the stripe active regions and adapted to emit the laser beams, and at a position perpendicular to the laser beams; a support member disposed on the bottom portion of the container to support the optical component; and a partial discharging pipe having one end thereof directly communicated with the outlet port, and the other end thereof directly communicated with a through-hole formed in the support member, wherein the pump is activated to discharge the liquid from the container through the outlet port in such a manner that a speed of the liquid flowing on the first surface along the optical axis direction of the semiconductor laser element and on the front end surface of the semiconductor laser element toward the partial discharging pipe is set higher than a speed of the liquid flowing on the other portions in the container.

In the above arrangement, the liquid is allowed to flow, in this order, on the first surface along the optical axis direction of the semiconductor laser element, along the front end surface of the semiconductor laser element, and through the partial discharging pipe. The speed of the liquid flowing along the above route is set higher than the speed of the liquid flowing on the other portions in the container. In the above arrangement, the heat generated in the semiconductor laser element can be rapidly transferred to the liquid. This enables to operate the semiconductor laser device at a low-consumption current and a low-consumption electric power, and with a watt-class high-output performance.

Preferably, the semiconductor laser device may further comprise: a wiring substrate disposed on a side wall of the container opposing to a rear end surface of the semiconductor laser element, wherein the wiring substrate includes a laser wiring electrode to be electrically connected to a laser electrode formed on the first surface of the semiconductor laser element via a conductive member.

In the above arrangement, even if the semiconductor laser element is immersed in the liquid, it is possible to electrically connect the laser electrode formed on the first surface of the semiconductor laser element to the laser wiring electrode of the wiring substrate with high reliability.

In the semiconductor laser device, preferably, the semiconductor laser element may be mounted on an upper surface of the base block, with the first surface of the semiconductor laser element close to the stripe active regions being oriented downward, and a second surface of the semiconductor laser element opposing to the first surface being oriented upward, and a front end surface of the semiconductor laser element may protrude from a front end surface of the base block.

In the above arrangement, the semiconductor laser element is mounted on the upper surface of the base block, with the first surface of the semiconductor laser element close to the stripe active regions being oriented downward, and the second surface of the semiconductor laser element opposing to the first surface being oriented upward. The front end surface of the semiconductor laser element protrudes from the front end surface of the base block. Accordingly, even in the case where the first surface close to the stripe active regions is contacted with the base block, the first surface can be efficiently cooled, because the front end surface of the semiconductor laser element protrudes from the front end surface of the base block.

In the semiconductor laser device, preferably, the active regions located at both outer ends of the stripe active regions may emit the laser beams of higher output than the laser beams to be emitted from the active regions located in the middle of the stripe active regions.

In the above arrangement, the active regions located at both outer ends of the stripe active regions emit the laser beams of higher output than the laser beams to be emitted from the active regions located in the middle of the stripe active regions. Accordingly, the laser output of the outer-located active regions can be set higher than the laser output of the middle-located active regions.

An image display device according to another aspect of the invention comprises: a screen; laser light sources; and an optical system for forming an image on the screen, using the laser light sources, wherein the laser light sources includes at least a red laser light source for emitting red laser beams, a green laser light source for emitting green laser beams, and a blue laser light source for emitting blue laser beams, and at least one of the red laser light source and the blue laser light source includes the aforementioned semiconductor laser device.

In the above arrangement, since the laser light sources can be operated at a low-consumption current and a low-consumption electric power, and with a long operation life, the image display device can be operated at a low-consumption current and a low-consumption electric power, and with a long operation life.

An image display device according to yet another aspect of the invention comprises: a liquid crystal display panel; and a backlight illuminator for illuminating the liquid crystal display panel from a backside, wherein the backlight illuminator includes at least a red laser light source for emitting red laser beams, a green laser light source for emitting green laser beams, and a blue laser light source for emitting blue laser beams, and at least one of the red laser light source and the blue laser light source includes the aforementioned semiconductor laser device.

In the above arrangement, since the laser light sources can be operated at a low-consumption current and a low-consumption electric power, and with a long operation life, the image display device can be operated at a low-consumption current and a low-consumption electric power, and with a long operation life.

The present invention is directed to efficiently operate the semiconductor laser element by uniformly supplying an electric current so as to operate the semiconductor laser device at a low-consumption current and a low-consumption electric power by an improved method for supplying an electric current to a high-output semiconductor laser device. This arrangement is useful in a large-screened display device, image display device, or like device having a large luminance requiring a watt-class laser light source.

The present invention is also directed to operate a semiconductor laser device at a low-consumption current and a low-consumption electric power by an improved method for efficiently cooling active regions of a semiconductor laser element of a high-output semiconductor laser device. This arrangement is useful in a large-screened display device, image display device, or like device having a large luminance requiring a watt-class laser light source.

This application is based on Japanese Patent Application No. 2007-31800 and No. 2007-50999 filed on Feb. 13, 2007, and Mar. 1, 2007, the contents of which are hereby incorporated by reference.

Although the present invention has been fully described by way of example with reference to the accompanying drawings, it is to be understood that various changes and modifications will be apparent to those skilled in the art. Therefore, unless otherwise such changes and modifications depart from the scope of the present invention hereinafter defined, they should be construed as being included therein.

What is claimed is:

1. A semiconductor laser device, comprising:
   a semiconductor laser element including stripe active regions for emitting laser beams;
   a base block on which wirings are formed, the wirings being electrically connected to stripe laser electrodes of said semiconductor laser element, respectively, the stripe laser electrodes corresponding to the stripe active regions being formed in proximity to a first surface of said semiconductor laser element, close to the stripe active regions; and
   a package for disposing said base block with said semiconductor laser element, said package including a connecting electrode part for connecting the semiconductor laser device to an external device, wherein
   an electric current is supplied to the stripe active regions from connecting portions between each of the laser electrodes and the wirings,
   a rear electrode is formed across a second surface of said semiconductor laser element, the second surface being formed in parallel to the first surface and opposing the first surface,
   respective ends of conductive wires are discreetly connected to the rear electrode at both ends and a middle portion of each corresponding stripe active region, and
   the respective other ends of the conductive wires are connected to the connecting electrode part.

2. The semiconductor laser device according to claim 1, wherein
   the wirings are respectively connected to electrode parts formed in a periphery of a laser mounting surface on said base block where said semiconductor laser element is mounted.

3. The semiconductor laser device according to claim 2, further comprising:
   a circuit board including a first substrate electrode part to be electrically connected to a corresponding electrode part, wherein
   a bump is formed on the first substrate electrode part, and
   the respective electrode parts and the first substrate electrode part are electrically connected to each other via the bump.

4. The semiconductor laser device according to claim 3, wherein
   a rear electrode is formed on a second surface of said semiconductor laser element, the second surface being formed in parallel to the first surface and opposing the first surface,
   the circuit board further includes a second substrate electrode part to be electrically connected to the rear electrode,
   a bump is formed on the second substrate electrode part, and
   the rear electrode and the second substrate electrode part are electrically connected to each other via the bump.

5. The semiconductor laser device according to claim 1, wherein
   the respective ends of the conductive wires are connected to the rear electrode at multiple sites thereof with a matrix pattern.

6. The semiconductor laser device according to claim 1, wherein
   the respective ends of the conductive wires are connected to the rear electrode at a position opposing the corresponding laser electrode with respect to the corresponding active region.

* * * * *